US011777066B2

(12) United States Patent
Hin et al.

(10) Patent No.: US 11,777,066 B2
(45) Date of Patent: Oct. 3, 2023

(54) FLIPCHIP INTERCONNECTED LIGHT-EMITTING DIODE PACKAGE ASSEMBLY

(71) Applicant: Lumileds LLC, San Jose, CA (US)

(72) Inventors: Tze Yang Hin, Cupertino, CA (US); Hung Khin Wong, George Town (MY)

(73) Assignee: Lumileds LLC, San Jose, CA (US)

( * ) Notice: Subject to any disclaimer, the term of this patent is extended or adjusted under 35 U.S.C. 154(b) by 365 days.

(21) Appl. No.: 17/132,359

(22) Filed: Dec. 23, 2020

(65) Prior Publication Data

US 2021/0202813 A1 Jul. 1, 2021

Related U.S. Application Data

(60) Provisional application No. 62/954,121, filed on Dec. 27, 2019.

(51) Int. Cl.
*H01L 33/62* (2010.01)
*H01L 27/15* (2006.01)
(Continued)

(52) U.S. Cl.
CPC ............ *H01L 33/62* (2013.01); *F21S 41/141* (2018.01); *H01L 25/167* (2013.01);
(Continued)

(58) Field of Classification Search
CPC ..... H01L 33/62; H01L 25/167; H01L 27/156; H01L 33/647; H01L 2933/0066;
(Continued)

(56) References Cited

U.S. PATENT DOCUMENTS 5,073,814 A 12/1991 Cole, Jr. et al.
5,336,453 A 8/1994 Giller et al.
(Continued)

FOREIGN PATENT DOCUMENTS

CN 102315208 A 1/2012
CN 204641532 U 9/2015
(Continued)

OTHER PUBLICATIONS

International Search Report and Written Opinion dated Feb. 11, 2021 for PCT International Application No. PCT/US2020/061205.
(Continued)

*Primary Examiner* — Victor A Mandala
(74) *Attorney, Agent, or Firm* — Volpe Koenig

(57) ABSTRACT

A light-emitting diode (LED) package assembly includes a substrate. The substrate includes a top surface, a bottom surface and an opening formed through the substrate. The opening includes a first portion adjacent the top surface and a second portion adjacent the bottom surface that is wider than the first portion such that portions of the substrate overhang the second portion of the opening. Pads are provided on a bottom surface of the portions of the substrate that overhang the second portion of the opening. The assembly also includes a hybridized device in the opening. The hybridized device includes a silicon backplane that has a top surface, a bottom surface and interconnects on the top surface. The interconnects are electrically coupled to the pads. The hybridized device also includes an LED array on the top surface of the silicon backplane.

9 Claims, 17 Drawing Sheets

(51) Int. Cl.
*H01L 33/64* (2010.01)
*H01L 25/16* (2023.01)
*F21S 41/141* (2018.01)

(52) U.S. Cl.
CPC .......... *H01L 27/156* (2013.01); *H01L 33/647* (2013.01); *H01L 2933/0066* (2013.01)

(58) Field of Classification Search
CPC ... H01L 33/64; H01L 25/0753; H01L 33/486; H05K 1/184; H05K 1/141; H05K 2201/09845; H05K 2201/10106; H05K 2201/1053; F21S 41/153; F21S 41/192; F21S 41/141
See application file for complete search history.

(56) References Cited

U.S. PATENT DOCUMENTS

| | | | |
|---|---|---|---|
| 6,730,391 B1 | 5/2004 | Saijo et al. | |
| 6,936,855 B1 | 8/2005 | Harrah | |
| 7,550,319 B2 | 6/2009 | Wang et al. | |
| 8,513,790 B2 | 8/2013 | Chen et al. | |
| 8,536,714 B2 | 9/2013 | Sakaguchi | |
| 8,773,006 B2 | 7/2014 | Kim et al. | |
| 8,851,682 B2 | 10/2014 | Tanigawa et al. | |
| 8,912,650 B2 | 12/2014 | Choi et al. | |
| 9,018,655 B2 | 4/2015 | Tu et al. | |
| 9,615,453 B2 | 4/2017 | Yang | |
| 9,653,397 B2 | 5/2017 | Kwon et al. | |
| 9,899,465 B2 | 2/2018 | Bower et al. | |
| 9,978,707 B1 | 5/2018 | Zimmerman et al. | |
| 10,005,384 B2 | 6/2018 | Canonne et al. | |
| 10,205,055 B2 | 2/2019 | Chu et al. | |
| 10,262,977 B2 | 4/2019 | Henry et al. | |
| 10,347,509 B1 | 7/2019 | Shen | |
| 10,388,875 B2 | 8/2019 | Yasumoto et al. | |
| 10,420,204 B2 | 9/2019 | Lin et al. | |
| 10,529,690 B2 | 1/2020 | Shih et al. | |
| 10,665,578 B2 | 5/2020 | Huitema et al. | |
| 10,683,986 B2 | 6/2020 | Lefaudeux et al. | |
| 10,754,473 B2 | 8/2020 | Teranishi et al. | |
| 2003/0020156 A1 | 1/2003 | Farquhar et al. | |
| 2003/0136577 A1 | 7/2003 | Abe | |
| 2005/0263867 A1 | 12/2005 | Kambe et al. | |
| 2005/0269287 A1 | 12/2005 | Tsujimura et al. | |
| 2006/0141851 A1 | 6/2006 | Matsui et al. | |
| 2007/0080458 A1 | 4/2007 | Ogawa et al. | |
| 2009/0046432 A1 | 2/2009 | Hsu | |
| 2009/0207630 A1 | 8/2009 | Satoh et al. | |
| 2010/0039817 A1 | 2/2010 | Wen et al. | |
| 2010/0155746 A1 | 6/2010 | Ibbetson et al. | |
| 2011/0030209 A1 | 2/2011 | Chang et al. | |
| 2011/0121347 A1 | 5/2011 | Liu et al. | |
| 2012/0106140 A1 | 5/2012 | Sun et al. | |
| 2012/0175643 A1* | 7/2012 | West ...................... H01L 33/62 | 438/26 |
| 2012/0188734 A1 | 7/2012 | Mikado et al. | |
| 2012/0273960 A1 | 11/2012 | Park et al. | |
| 2013/0075924 A1 | 3/2013 | Lin et al. | |
| 2013/0193463 A1 | 8/2013 | Kong et al. | |
| 2013/0221452 A1 | 8/2013 | Strothmann et al. | |
| 2013/0328067 A1 | 12/2013 | Tsou et al. | |
| 2014/0021493 A1 | 1/2014 | Andrews et al. | |
| 2014/0061930 A1 | 3/2014 | Holmes et al. | |
| 2014/0124777 A1 | 5/2014 | Nakatani et al. | |
| 2014/0182896 A1 | 7/2014 | Lee et al. | |
| 2014/0251658 A1 | 9/2014 | Lin et al. | |
| 2014/0268780 A1 | 9/2014 | Wang et al. | |
| 2014/0306845 A1 | 10/2014 | Shiu et al. | |
| 2015/0022088 A1* | 1/2015 | Gershowitz ........... F21V 23/006 | 362/249.02 |
| 2015/0054001 A1 | 2/2015 | Oganesian et al. | |
| 2015/0054406 A1 | 2/2015 | Gershowitz et al. | |
| 2015/0084206 A1 | 3/2015 | Lin | |
| 2015/0200185 A1 | 7/2015 | Yu et al. | |
| 2015/0303219 A1 | 10/2015 | Tada | |
| 2015/0319868 A1 | 11/2015 | Wei et al. | |
| 2015/0371585 A1 | 12/2015 | Bower et al. | |
| 2016/0050771 A1 | 2/2016 | Yu et al. | |
| 2016/0172402 A1 | 6/2016 | Katkar | |
| 2016/0181480 A1* | 6/2016 | Cumpston ............... H01L 33/20 | 174/255 |
| 2016/0273741 A1 | 9/2016 | Jung | |
| 2016/0316565 A1 | 10/2016 | Chen et al. | |
| 2016/0324004 A1 | 11/2016 | Schwarz et al. | |
| 2017/0009978 A1 | 1/2017 | Hong et al. | |
| 2017/0025593 A1 | 1/2017 | Bower et al. | |
| 2017/0033062 A1 | 2/2017 | Liu et al. | |
| 2017/0040306 A1 | 2/2017 | Kim et al. | |
| 2017/0062383 A1 | 3/2017 | Yee et al. | |
| 2017/0092627 A1 | 3/2017 | Hu et al. | |
| 2017/0140202 A1 | 5/2017 | Huang et al. | |
| 2017/0221865 A1* | 8/2017 | West ........................ H01L 33/62 | |
| 2017/0358562 A1 | 12/2017 | Banna et al. | |
| 2018/0166373 A1* | 6/2018 | Lin ................... H01L 23/49833 | |
| 2018/0166429 A1 | 6/2018 | Chong et al. | |
| 2018/0175262 A1 | 6/2018 | Jansen et al. | |
| 2018/0197471 A1 | 7/2018 | Rotzoll et al. | |
| 2018/0226386 A1 | 8/2018 | Cok | |
| 2018/0269188 A1 | 9/2018 | Yu et al. | |
| 2018/0269191 A1 | 9/2018 | England et al. | |
| 2018/0269234 A1* | 9/2018 | Hughes ................. H01L 27/156 | |
| 2018/0337135 A1 | 11/2018 | Yoshihiro et al. | |
| 2018/0337142 A1 | 11/2018 | Cheng et al. | |
| 2018/0358317 A1 | 12/2018 | Albers et al. | |
| 2019/0006283 A1 | 1/2019 | Wang et al. | |
| 2019/0056067 A1 | 2/2019 | Price et al. | |
| 2019/0066571 A1 | 2/2019 | Goward | |
| 2019/0075656 A1 | 3/2019 | Kim et al. | |
| 2019/0088603 A1 | 3/2019 | Marimuthu et al. | |
| 2019/0096864 A1 | 3/2019 | Huitema et al. | |
| 2019/0181315 A1 | 6/2019 | Liao et al. | |
| 2019/0206833 A1 | 7/2019 | Meyer et al. | |
| 2019/0302917 A1* | 10/2019 | Pan ...................... H01L 27/1266 | |
| 2019/0305205 A1* | 10/2019 | Feichtinger ........... H01L 33/647 | |
| 2019/0319020 A1 | 10/2019 | Pan | |
| 2019/0333444 A1 | 10/2019 | He et al. | |
| 2019/0360673 A1 | 11/2019 | Seo | |
| 2019/0385513 A1 | 12/2019 | Iguchi et al. | |
| 2020/0105638 A1 | 4/2020 | Chiang et al. | |
| 2020/0119235 A1 | 4/2020 | Ahmed et al. | |
| 2020/0176346 A1 | 6/2020 | Wu et al. | |
| 2020/0251626 A1 | 8/2020 | Lee et al. | |
| 2021/0028766 A1 | 1/2021 | Hurwitz et al. | |
| 2021/0074645 A1 | 3/2021 | Tsai et al. | |
| 2021/0125971 A1 | 4/2021 | Chu et al. | |
| 2021/0151648 A1* | 5/2021 | Hin ........................ H01L 25/167 | |

FOREIGN PATENT DOCUMENTS

| | | |
|---|---|---|
| CN | 107580385 A | 1/2018 |
| EP | 3113236 | 1/2017 |
| EP | 3582593 A1 | 12/2019 |
| JP | 2007-129188 A | 5/2007 |
| JP | 2008-283133 A | 11/2008 |
| JP | 2009-186734 A | 8/2009 |
| JP | 2011-113989 A | 6/2011 |
| KR | 10-2013-0036650 A | 4/2013 |
| TW | 200830975 A | 7/2008 |
| TW | 200942105 A | 10/2009 |
| WO | 2018/116814 A1 | 6/2018 |
| WO | 2018/172152 | 9/2018 |
| WO | 2019/013469 | 1/2019 |
| WO | 2019/168763 A1 | 9/2019 |

OTHER PUBLICATIONS

International Search Report and Written Opinion dated Feb. 17, 2021 for PCT International Application No. PCT/US2020/061206.
Annex to Form PCT/ISA/206, Communication Relating to the Results of the Partial International Search dated Mar. 4, 2021 for PCT International Application No. PCT/US2020/061201.

(56) References Cited

OTHER PUBLICATIONS

Extended European Search Report dated Sep. 2, 2020 for European Patent Application No. 20158481.0.
Extended European Search Report dated Jul. 7, 2020 for European Patent Application No. 20157985.1.
Extended European Search Report dated Jul. 30, 2020 for European Patent Application No. 20158288.9.
Extended European Search Report dated Sep. 11, 2020 for European Patent Application No. 20166601.3.
Extended European Search Report dated Oct. 19, 2020 for the European Patent Application No. 20169027.8.
International Search Report and Written Opinion dated Apr. 8, 2021 for PCT International Application No. PCT/US2021/012425.
International Search Report and Written Opinion dated Apr. 16, 2021 for PCT International Application No. PCT/US2020/066998.
International Search Report and Written Opinion dated Apr. 28, 2021 for PCT International Application No. PCT/US2020/061201.
U.S. Appl. No. 16/814,024, filed Mar. 10, 2020.
U.S. Appl. No. 16/750,809, filed Jan. 23, 2020, which claims the benefit of U.S. Appl. No. 62/951,601, filed Dec. 20, 2019 and U.S. Appl. No. 62/937,629, filed Nov. 19, 2019.
U.S. Appl. No. 16/750,824, filed Jan. 23, 2020, which claims the benefit of U.S. Appl. No. 62/951,601, filed Dec. 20, 2019 and U.S. Appl. No. 62/937,629, filed Nov. 19, 2019.
U.S. Appl. No. 16/750,839, filed Jan. 23, 2020, which claims the benefit of U.S. Appl. No. 62/951,601, filed Dec. 20, 2019 and U.S. Appl. No. 62/937,629, filed Nov. 19, 2019.
U.S. Appl. No. 16/831,378, filed Mar. 26, 2020, which claims the benefit of U.S. Appl. No. 62/826,612, filed Mar. 29, 2019.
U.S. Appl. No. 16/831,384, filed Mar. 26, 2020, which claims the benefit of U.S. Appl. No. 62/826,612, filed Mar. 29, 2019.
U.S. Appl. No. 16/809,104, filed Mar. 4, 2020, which claims the benefit of U.S. Appl. No. 62/958,058, filed Jan. 7, 2020.
International Search Report and Written Opinion dated Jun. 29, 2021 for PCT International Application No. PCT/US2021/021702.

\* cited by examiner

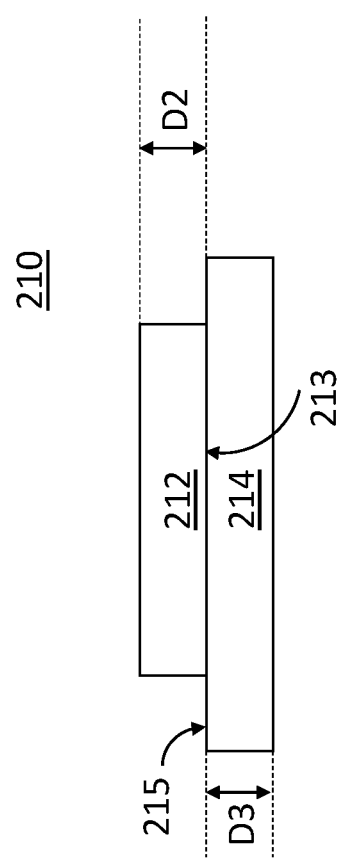

FLIPCHIP INTERCONNECTED LIGHT-EMITTING DIODE PACKAGE ASSEMBLY

CROSS REFERENCE TO RELATED APPLICATION(S)

This application claims the benefit of U.S. Provisional Application No. 62/954,121, filed Dec. 27, 2019, which is incorporated by reference as if fully set forth.

BACKGROUND

Precision control lighting applications may require production and manufacturing of small addressable light-emitting diode (LED) lighting systems. The smaller size of such systems may require unconventional components and manufacturing processes.

SUMMARY

A light-emitting diode (LED) package assembly includes a substrate that has a top surface, a bottom surface and an opening formed through the substrate. The opening includes a first portion adjacent the top surface and a second portion adjacent the bottom surface that is wider than the first portion such that portions of the substrate overhang the second portion of the opening. Pads are provided on a bottom surface of the portions of the substrate that overhang the second portion of the opening. The assembly also includes a hybridized device in the opening. The hybridized device includes a silicon backplane that has a top surface, a bottom surface and interconnects on the top surface. The interconnects are electrically coupled to the pads. The hybridized device also includes an LED array on the top surface of the silicon backplane.

BRIEF DESCRIPTION OF THE DRAWINGS

A more detailed understanding can be had from the following description, given by way of example in conjunction with the accompanying drawings wherein:

FIG. 2A is a cross-sectional view of an example hybridized device;

DETAILED DESCRIPTION

Figure 1:
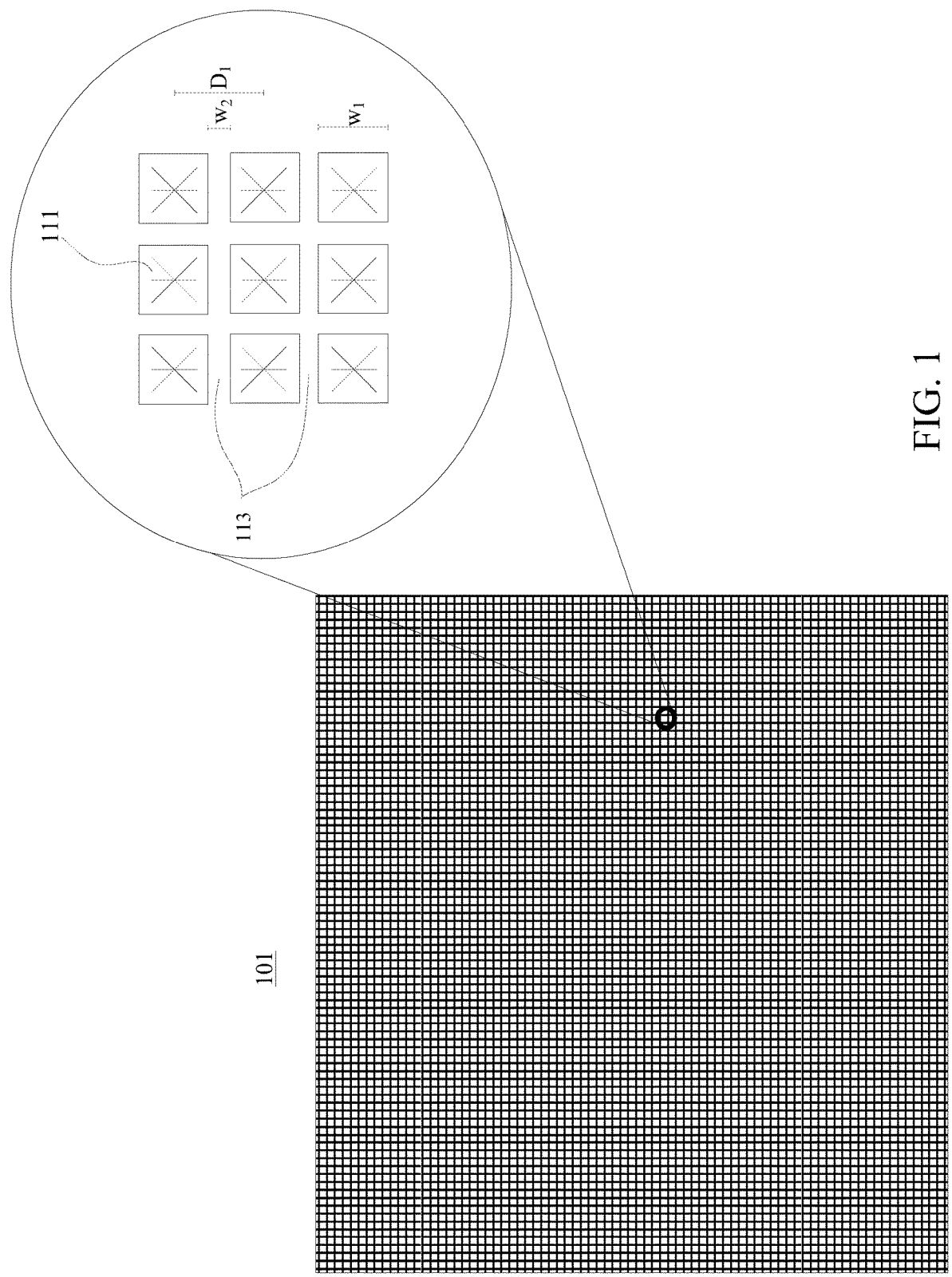
FIG. 1 is a top view of an example LED array.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Further, whether the LEDs, LED arrays, electrical components and/or electronic components are housed on one, two or more electronics boards may also depend on design constraints and/or application.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for handheld battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

LEDs may be arranged into arrays for some applications. For example, LED arrays may support applications that benefit from fine-grained intensity, spatial, and temporal control of light distribution. This may include, but is not limited to, precise spatial patterning of emitted light from pixel blocks or individual pixels. Depending on the application, emitted light may be spectrally distinct, adaptive over time and/or environmentally responsive. LED arrays may provide pre-programmed light distribution in various intensity, spatial or temporal patterns. The emitted light may be based at least in part on received sensor data and may be used for optical wireless communications. Associated electronics and optics may be distinct at an emitter, emitter block or device level.

LED arrays may be formed from one, two or three dimensional arrays of LEDs, VCSELs, OLEDs, or other controllable light emitting systems. LED arrays may be formed as emitter arrays on a monolithic substrate, formed by partial or complete segmentation of a substrate, formed using photolithographic, additive, or subtractive processing, or formed through assembly using pick and place or other suitable mechanical placement. LED arrays may be uniformly laid out in a grid pattern, or, alternatively, may be positioned to define geometric structures, curves, random, or irregular layouts.

FIG. 1 is a top view of an example LED array 101. In the example illustrated in FIG. 1, the LED array 101 is an array of emitters 111. Emitters 111 in the LED array 101 may be individually addressable or may be addressable in groups/subsets.

An exploded view of a 3×3 portion of the LED array 101 is also shown in FIG. 1. As shown in the 3×3 portion exploded view, the LED array 101 may include emitters 111 that each have a width $w_1$. In embodiments, the width $w_1$ may be approximately 100 μm or less (e.g., 40 μm). Lanes 113 between the emitters 111 may be a width, $w_2$, wide. In embodiments, the width $w_2$ may be approximately 20 μm or less (e.g., 5 μm). In some embodiments, the width $w_2$ may be as small as 1 μm. The lanes 113 may provide an air gap between adjacent emitters or may contain other material. A distance $D_1$ from the center of one emitter 111 to the center of an adjacent emitter 111 may be approximately 120 μm or less (e.g., 45 μm). It will be understood that the widths and distances provided herein are examples only and that actual widths and/or dimensions may vary.

It will be understood that, although rectangular emitters arranged in a symmetric matrix are shown in FIG. 1, emitters of any shape and arrangement may be applied to the embodiments described herein. For example, the LED array 101 of FIG. 1 may include over 20,000 emitters in any applicable arrangement, such as a 200×100 matrix, a symmetric matrix, a non-symmetric matrix, or the like. It will also be understood that multiple sets of emitters, matrixes, and/or boards may be arranged in any applicable format to implement the embodiments described herein.

As mentioned above, LED arrays, such as the LED array 101, may include up to 20,000 or more emitters. Such arrays may have a surface area of 90 $mm^2$ or greater and may require significant power to power them, such as 60 watts or more. An LED array such as this may be referred to as a micro LED array or simply a micro LED. In some embodiments, micro LEDs may include hundreds, thousands or even millions of LEDs or emitters positioned together on centimeter scale area substrates or smaller. A micro LED may include an array of individual emitters provided on a substrate or may be a single silicon wafer or die partially or fully divided into segments that form the emitters.

A controller may be coupled to selectively power subgroups of emitters in an LED array to provide different light beam patterns. At least some of the emitters in the LED array may be individually controlled through connected electrical traces. In other embodiments, groups or subgroups of emitters may be controlled together. In some embodiments, the emitters may have distinct non-white colors. For example, at least four of the emitters may be RGBY groupings of emitters.

LED array luminaires may include light fixtures, which may be programmed to project different lighting patterns based on selective emitter activation and intensity control. Such luminaires may deliver multiple controllable beam patterns from a single lighting device using no moving parts. Typically, this is done by adjusting the brightness of individual LEDs in a 1D or 2D array. Optics, whether shared or individual, may optionally direct the light onto specific target areas. In some embodiments, the height of the LEDs, their supporting substrate and electrical traces, and associated micro-optics may be less than 5 millimeters.

LED arrays, including LED or μLED arrays, may be used to selectively and adaptively illuminate buildings or areas for improved visual display or to reduce lighting costs. In addition, such LED arrays may be used to project media facades for decorative motion or video effects. In conjunction with tracking sensors and/or cameras, selective illumination of areas around pedestrians may be possible. Spectrally distinct emitters may be used to adjust the color temperature of lighting, as well as support wavelength specific horticultural illumination.

Street lighting is an important application that may greatly benefit from use of LED arrays. A single type of LED array may be used to mimic various street light types, allowing, for example, switching between a Type I linear street light and a Type IV semicircular street light by appropriate activation or deactivation of selected emitters. In addition, street lighting costs may be lowered by adjusting light beam intensity or distribution according to environmental conditions or time of use. For example, light intensity and area of distribution may be reduced when pedestrians are not present. If emitters are spectrally distinct, the color temperature of the light may be adjusted according to respective daylight, twilight, or night conditions.

LED arrays are also well suited for supporting applications requiring direct or projected displays. For example, warning, emergency, or informational signs may all be displayed or projected using LED arrays. This allows, for example, color changing or flashing exit signs to be projected. If an LED array includes a large number of emitters, textual or numerical information may be presented. Directional arrows or similar indicators may also be provided.

Vehicle headlamps are an LED array application that may require a large number of pixels and a high data refresh rate. Automotive headlights that actively illuminate only selected sections of a roadway may be used to reduce problems associated with glare or dazzling of oncoming drivers. Using infrared cameras as sensors, LED arrays may activate only those emitters needed to illuminate the roadway while deactivating emitters that may dazzle pedestrians or drivers of oncoming vehicles. In addition, off-road pedestrians, animals, or signs may be selectively illuminated to improve driver environmental awareness. If emitters are spectrally distinct, the color temperature of the light may be adjusted according to respective daylight, twilight, or night conditions. Some emitters may be used for optical wireless vehicle to vehicle communication.

To individually drive or control the individual LEDs or emitters in the array, a silicon backplane may be provided in close proximity to the LED array. In some embodiments, the silicon backplane may include circuitry to receive power from one or more sources to power various portions of the silicon backplane, circuitry to receive image input from one or more sources for displaying an image via the LED array, circuitry for communications between the silicon backplane and external controllers (e.g., vehicle headlamp controls, general lighting controls, etc.), circuitry for generating a signal, such as a pulse width modulated (PWM) signal, for controlling operation of the individual LEDs or emitters in the array based on, for example, received image input and communications received from external sources and a number of LED drivers for individually driving the LEDs or emitters in the array based on the generated signal. In embodiments, the silicon backplane may be a complementary metal-oxide-semiconductor (CMOS) backplane, which may include the same number of drivers as LEDs or emitters in a corresponding LED array. In some embodiments, the silicon backplane may be an application specific integrated circuit (ASIC). In some embodiments, one driver may be provided for each group of some number of LEDs or emitters and control may be of groups of LEDs or emitters rather than individual. Each driver may be electrically coupled individually to the corresponding LED or emitter or groups of LEDs or emitters. While the silicon backplane is described above with respect to particular circuitry, one of ordinary skill in the art will understand that a silicon backplane used for driving an LED array, such as described herein, may include more, less or different components that potentially carry out different functions without departing from the embodiments described herein.

As mentioned above, the individual drivers in the silicon backplane may be electrically coupled to individual LEDs or emitters or groups of LEDs or emitters in the LED array. As such, the LED array must be placed in close proximity to the silicon backplane. In embodiments, this may be accomplished by individually coupling copper pillar bumps or other connectors in an array of copper pillar bumps or connectors on a surface of the LED array to corresponding connectors on an opposing surface of the silicon backplane. A silicon backplane, such as described above, may become extremely hot during operation, particularly given its close proximity to the LED array. Accordingly, heat dissipation can be challenging for such devices. While some solutions are known for heat dissipation for semiconductor devices, such solutions often include structures that dissipate heat through the top of the device. Due to light-emission from the LED arrays, however, heat dissipation through the top of the device may not be practical or possible. Embodiments described herein provide for structures that may enable effective and efficient heat dissipation through the bottom surface of the device.

Additionally, an LED array, such as the LED array 101, and the associated silicon backplane, may require a number of passive elements, such as resistors, capacitors, and crystals, to be placed on a circuit board in close proximity to the silicon backplane. In addition to providing heat dissipation through the bottom surface of the device, embodiments described herein may also provide for an LED package that enables placement of a large number of passive components (e.g., 27 or more) on a top surface of the circuit board and in close proximity to the backplane and LED array. Further, embodiments described herein may provide for a low profile LED array package that may accommodate one or more passive elements and enable dissipation of heat generated by the silicon backplane and the LED array.

FIG. 2A is a cross-sectional view of an example hybridized device 210. In the example illustrated in FIG. 2A, the hybridized device 210 includes a silicon backplane 214. A first surface 213 of an LED array 212, such as a µLED, may be mounted on a first surface 215 of the silicon backplane 214. The first surface 215 of the silicon backplane 214 may also be referred to herein as a top surface, and the first surface 213 of the LED array 214 may also be referred to herein as a bottom surface, for simplicity of description. However, one of ordinary skill in the art will understand that the first surface 215 may be a bottom surface if the hybridized device 210 is turned upside, a side surface if the hybridized device 210 is turned sideways, etc. Similarly, the first surface 213 may be become a top surface if the hybridized device 210 is turned upside down, a side surface if the hybridized device is 210 is turned sideways, etc. As mentioned above, an array of connectors (not shown) on the first surface 215 of the silicon backplane 214 may be soldered, reflowed or otherwise electrically and mechanically coupled to an array of connectors on the bottom surface of the LED array 212. The array of connectors may be any array of connectors, such as an array of copper pillar bumps. The LED array 212 may have a depth D2. In embodiments, the depth D2 may be, for example, between 5 and 250 µm. The silicon backplane 214 may have a depth D3. In embodiments, the depth D2 may be, for example, between 100 µm and 1 mm. The hybridized device 210 may also be referred to as a hybridized die.

Figure 2B:
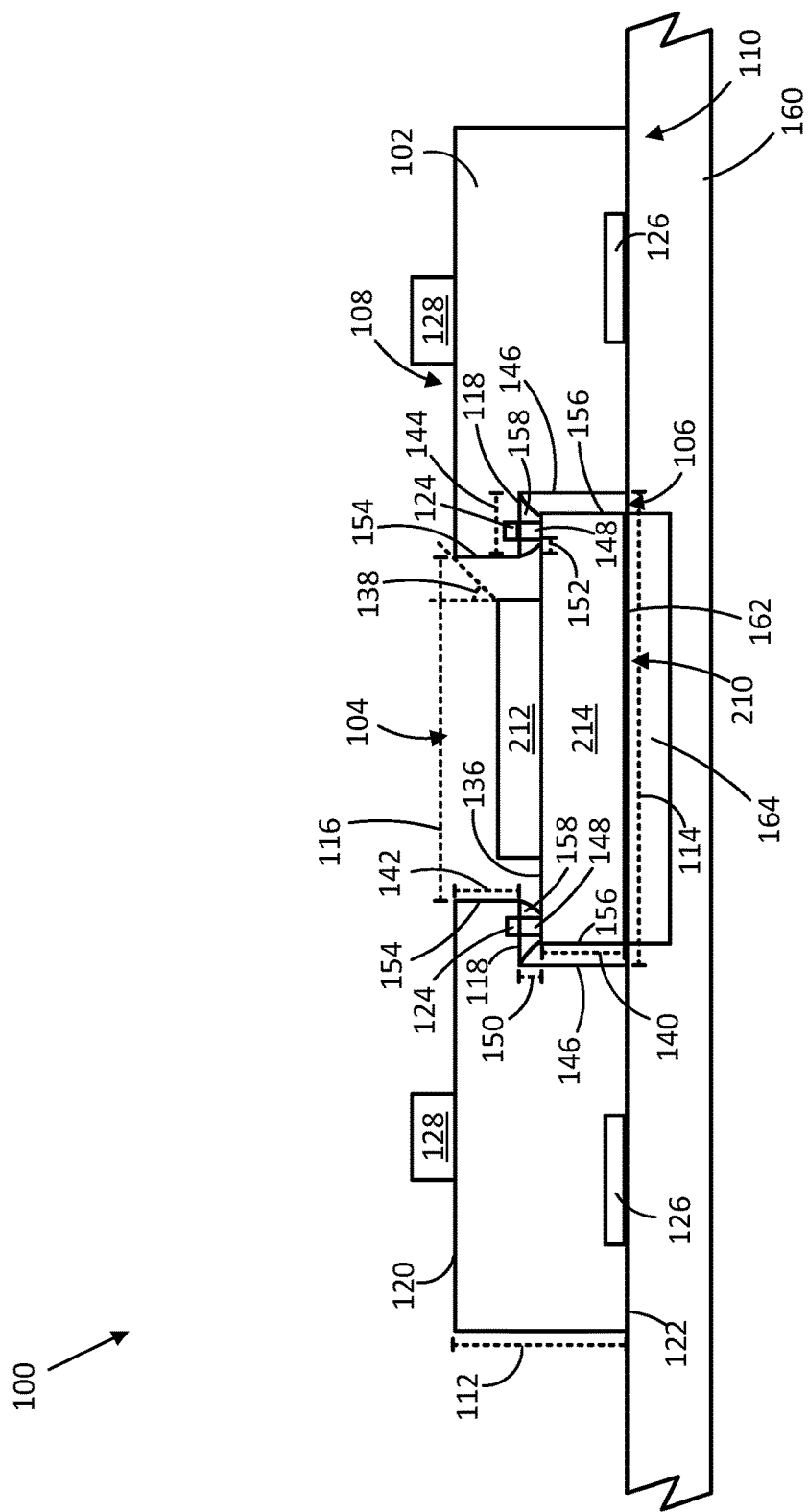
FIG. 2B is a cross-sectional view of an example LED package assembly.

FIG. 2B is a cross-sectional view of an example LED package assembly 100 incorporating the example hybridized device 210 of FIG. 2A. In the example illustrated in FIG. 2B, the hybridized device 210 is packaged in a packaging substrate 102. The LED package assembly 100 may utilize flipchip interconnects for one or more interconnections as described further herein and may be implemented in a lighting system, such as with a light (such as a vehicle headlight and/or other lights) and/or a display system (such as a computer display, a television display, and/or other displays).

The substrate 102 may include or be formed from a core material. For example, the substrate 102 may be a high-density organic substrate, such as a glass-reinforced epoxy laminate material including FR-4 substrate material. The substrate 102 may include one or more electrically-conductive elements, such as conductive layers, traces, vias, pads, or some combination thereof (not shown). The electrically-conductive elements may be interspersed within the core material, and may provide for conduction of electricity through the substrate 102 and/or provide for coupling of other elements to the substrate. In some embodiments, the substrate 102 may have a thickness 112 of approximately (within 0.1 millimeter (mm)) 1 mm.

The substrate 102 may have an aperture 104 formed in or through the substrate 102 and a recess 106 that extends into the substrate 102. The aperture 104 and the recess 106 may be collectively referred to herein as an opening or a cavity with the aperture and recess being referred to as first and second portions of the opening. The aperture 104 may be located at a first side 108 of the substrate 102. The recess 106 may extend into the substrate 102 from a second side 110 and may abut the aperture 104. In particular, the recess 106 may extend from the second side 110 and extend partially through the substrate 102. The aperture 104 may extend from the first side 108 of the substrate 102 to the recess 106, thereby having the aperture 104 connected with the recess 106. The recess 106 may have a width 114, and the aperture 104 may have a width 116, where the width 114 of the recess 106 is greater than the width 116 of the aperture 104. The substrate 102 may include an intermediate surface 118 located between a first or top surface 120 of the substrate 102 and a second or bottom surface 122 of the substrate 102. The intermediate surface 118 may abut the recess 106 and overhang the recess. In some embodiments, the intermediate surface 118 may be substantially (within 10 degrees) parallel with the first surface 120 and/or the second surface 122. The intermediate surface 118 may be approximately (within 10 µm) 500 µm from the first surface 120, where a portion of the substrate 102 located between the intermediate surface 118 and the first surface 120 may have a thickness 142 of approximately (within 10 µm) 500 µm. Further, the intermediate surface 118 may extend for a length 144 of approximately (within 0.1 mm) 1.027 mm from the sides 146 of the recess 106. The intermediate surface 118 may be formed by the difference between the width 114 of the recess 106 and the width 116 of the aperture 104.

The substrate 102 may include one or more pads 124 located at the intermediate surface 118. The pads 124 may abut the recess 106 and may be utilized for coupling components to the substrate 102 at the intermediate surface 118. The pads 124 may be formed of electrically-conductive material (such as copper, silver, aluminum, alloys thereof, and/or combinations thereof) and may be coupled to other electrically-conductive elements of the substrate. Accordingly, the pads 124 may provide electrical coupling with components coupled to the substrate 102 via the pads 124.

The substrate 102 may further include one or more pads 126 located at the second surface 122 of the substrate 102. In some embodiments, the pads 126 may comprise an array of pads. For example, the pads 126 may comprise a land-grid array (LGA) in some embodiments. In other embodiments, the pads 126 may comprise a ball grid array (BGA). The pads 126 may be utilized for electrical coupling of the substrate 102 to an external circuit board. In embodiments, the pads 126 may be coupled to other electrically-conductive elements of the substrate, the LED array 212, and/or the silicon backplane 214 to create an electrical connection between the external circuit board, electronic components provided on the substrate 102, the LED array 212 and/or the silicon backplane 214.

The LED package assembly 100 may further include one or more electronic components 128 mounted to the first surface 120 of the substrate 102. In some embodiments, the electronic components 128 may be passive components, such as resistors, capacitors, inductors, other passive components, or some combination thereof. In other embodiments, the electronic components 128 may comprise passive components, active components, or some combination thereof. The electronic components 128 may be coupled to one or more of the electrically-conductive elements of the substrate 102 and, thereby, also to one or more of the pads 126, the silicon backplane 214, the LED array 214 and/or other electronic components 128.

The hybridized device 210 may be coupled to the substrate 102 and may also be electrically coupled to one or more of the electronic components 128 and the pads 126 via electrically-conductive elements of the substrate 102. The silicon backplane 214 may be coupled to the substrate 102 via the pads 124. The silicon backplane 214 may be located partially or entirely within the recess 106. In some embodiments, the silicon backplane 214 may have a thickness 140 of approximately (within 10 micrometers (µm)) 725 µm, and the silicon backplane 214 may extend out of the recess 106 past the second surface 122 of the substrate 102 by approximately (within 10 µm) 325 µm. In some embodiments, the silicon backplane 214 may have a thickness between 300 microns and 750 microns. Further, sides 156 of the silicon backplane 214 may be located approximately (within 10 µm) 500 µm from the sides 146 of the recess 106 in some embodiments. The LED die 212 may be coupled to the first side 136 of the silicon backplane 214 and may be located between the first surface 120 of the substrate 102 and the silicon backplane 214. In some embodiments, the LED die 212 may be partially located within the aperture 104.

LEDs or segments of the LED array 212 may be directed through the aperture 104, and light emitted by the LEDs or segments may be directed through the aperture 104. In some embodiments, edges of the LED array 212 and edges of the first surface 120 of the substrate 102 that abut the aperture 104 may be separated by a certain distance that allows light emitted by the LEDs of the LED array 212 to be emitted at an angle 138 to the edges of the LED array 212. In some embodiments, the angle 138 may be approximately (within 10 degrees) 45 degrees. In other embodiments, LED package assembly 100 may be designed with a different angle 138 at which the light may be emitted from the LED array 212.

The LED package assembly 100 may further include one or more flipchip interconnects 148 that couple the hybridized device 210 to the substrate 102. In particular, the flipchip interconnects 148 may couple the silicon backplane 214 to the pads 124 of the substrate 102. The flipchip interconnects 148 may be or include one or more solder bump joints, one or more copper pillar bump joints, or some combination thereof. The flipchip interconnects 148 may be electrically conductive and may electrically couple the silicon backplane 214 to the substrate 102 to provide electrical coupling and/or signal exchange between the silicon backplane 214 and one or more of the electronic components 128 and the pads 126 via electrically conductive elements in the substrate 102 (not shown). In some embodiments, the flipchip interconnects 148 may maintain a distance between the intermediate surface 118 and the first side 136 of the silicon backplane 214. For example, the flipchip interconnects 148 may have a thickness 150 of approximately (within 10 µm) 100 µm in some embodiments. Further, the flipchip interconnects 148 may be located at a distance 152 of approximately (within 10 µm) 340 µm from sides 154 of the aperture 104 and/or approximately (within 10 µm) 0.187 µm from the sides 156 of the silicon backplane 214.

Utilizing the flipchip interconnects 148 to couple the silicon backplane 214 to the pads 124 of the substrate 102 may provide one or more advantages over other means of coupling. For example, the flipchip interconnects 148 may provide better thermal performance. Further, the flipchip interconnects 148 may provide for smaller pitch interconnects, which may allow for higher density of interconnects. One having ordinary skill in the art may recognize additional advantages to utilizing the flipchip interconnects 148.

The LED package assembly 100 may further include an underfill material 158 that may cover at least the flipchip interconnects 148. For example, the underfill material 158 may encircle each of the flipchip interconnects 148 and prevent the flipchip interconnects 148 from being exposed. The underfill material 158 may be or include an electrically-insulating material, which may prevent shorting between the flipchip interconnects 148 or between the flipchip interconnects 148 and other electrically-conductive elements in some embodiments. Further, the underfill material 158 may provide physical support for the coupling between the silicon backplane 132 and the substrate 102. In some embodiments, the underfill material 158 may be omitted. In other embodiments, the underfill material 158 may cover a larger surface area than is shown in FIG. 2B by, for example, filling more of the empty space between the hybridized device 210 and the substrate 102.

The LED package assembly 100 may include a circuit board 160. The circuit board 160 may be coupled to the substrate 102 via the pads 126. The board 160 may include circuitry that may provide control signaling and/or other data, such as image data, that may be provided to hybridized device 210, where the image data may affect the operation of the LED array 212. The circuit board 160 may include an integrated heatsink 164. The integrated heatsink 164 may be or include a thermally-conductive material, such as copper. The integrated heatsink 164 may be located adjacent to the silicon backplane 214 and may be thermally coupled to a second side 162 of the silicon backplane 214, the second side 162 being opposite from the first side 136, and may provide cooling for the silicon backplane 214. The direct coupling between the silicon backplane 214 and the integrated heatsink 164 may enable better heat dissipation for the hybridized device 210 and also heat dissipation through the bottom surface of the hybridized device 210 rather than through the top surface such that efficient heat dissipation may be accomplished without blocking light emission from the LED array 212.

Figure 2C:
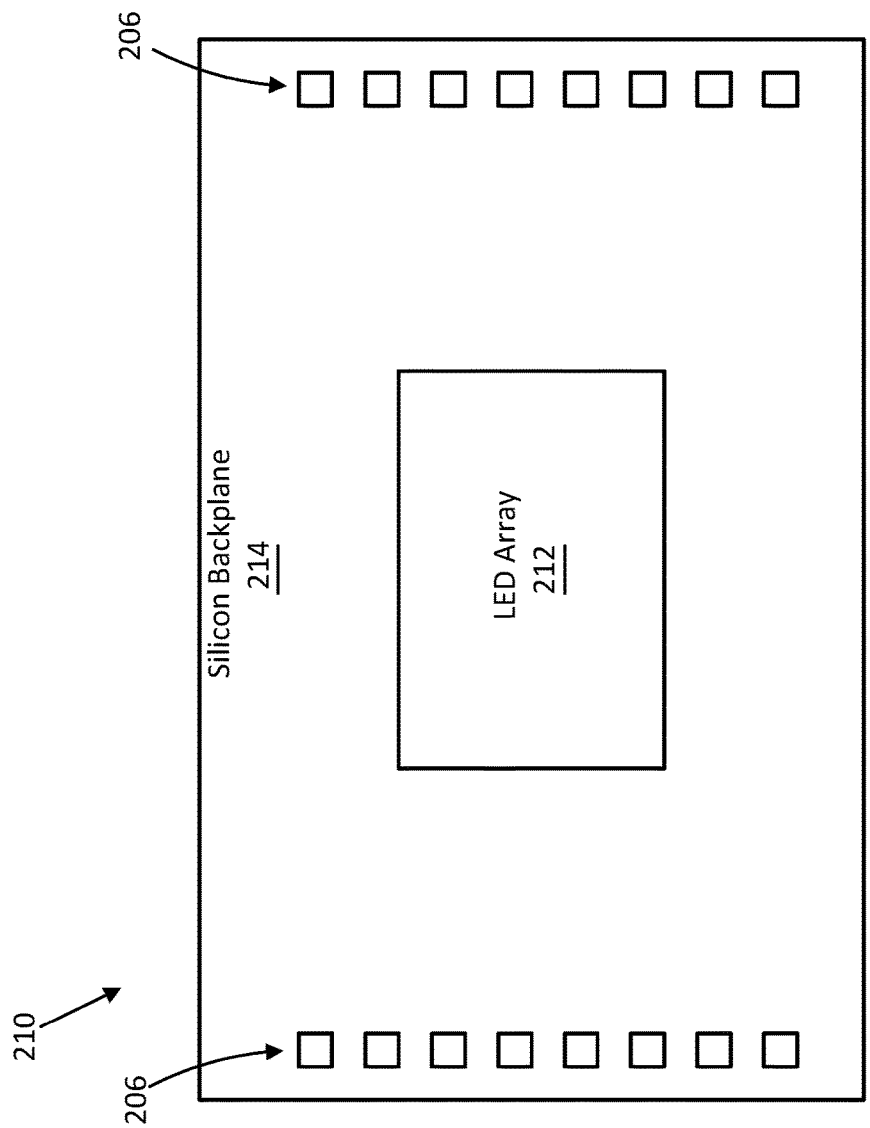
FIG. 2C is a top view of the example hybridized device.

FIG. 2C is a top view of the example hybridized device 210 of FIGS. 2A and 2B, according to some embodiments. In the example illustrated in FIG. 2C, the hybridized device 210 includes the LED array 212 and the silicon backplane 214. The silicon backplane 210 may be coupled to the LED array 212, such as being coupled by one or more interconnects (such solder bump joints and/or copper pillar bump joints).

As can be seen in FIG. 2C, the silicon backplane 214 may have a larger footprint than a footprint of the LED array 212, thereby having a portion of the silicon backplane 214 extending outside of the footprint of the LED array 212. The silicon backplane 214 may include one or more pads 206. The pads 206 may be located on the portion of the silicon backplane 214 extending outside of the footprint of the LED array 212 and at a surface of the silicon backplane 214. The pads 206 may be coupled to the circuitry within the silicon backplane 214 and may be utilized for coupling components to the silicon backplane 214. For example, the flipchip interconnects 148 may be coupled to the pads 206 and may be utilized for coupling the substrate 102 to the silicon backplane 214.

Figure 3:
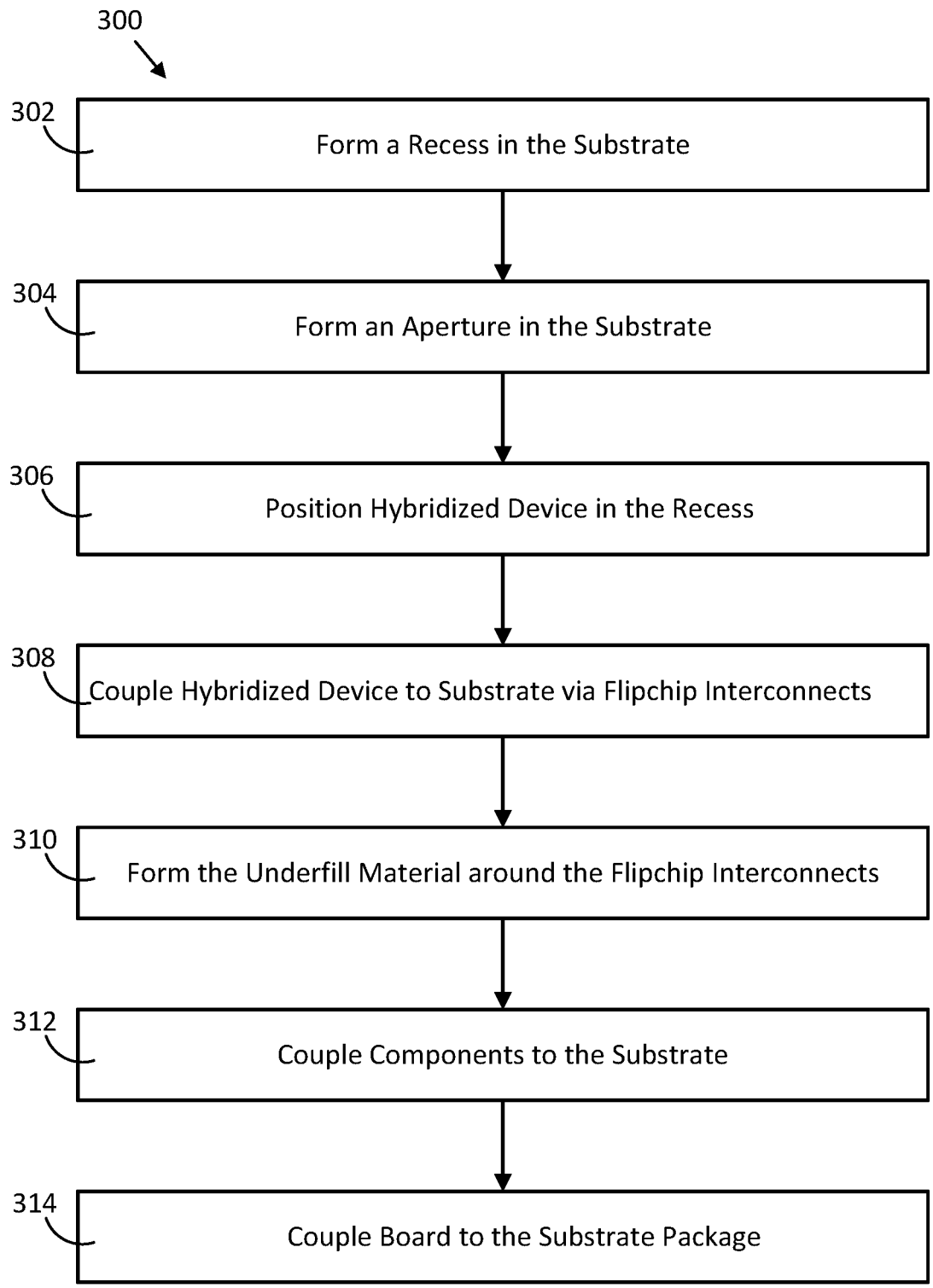
FIG. 3 is a flow diagram of an example method of manufacturing an LED package assembly.

FIG. 3 is a flow diagram of an example method 300 of manufacturing an LED package assembly. For example, the procedure 300 may be used to manufacture the LED package assembly 100.

Figure 4:
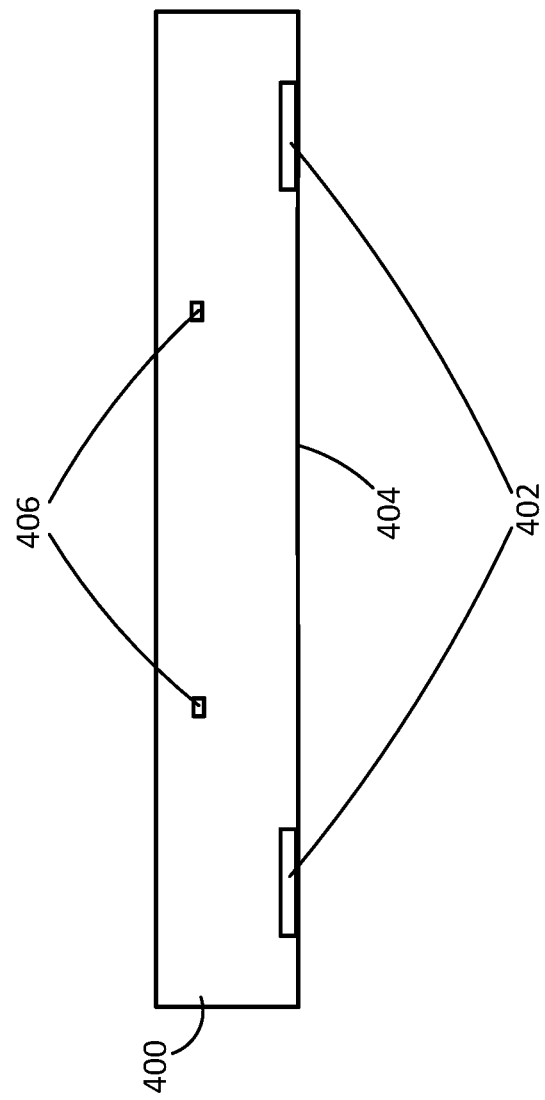
FIG. 4 is a cross-sectional view of an example substrate that may be used for the method FIG. 3.

The method 300 may initiate with a substrate. For example, FIG. 4 is a cross-sectional view of an example substrate 400 that may be used for the method 300 of FIG. 3, according to some embodiments. The substrate 400 may include one or more of the features of the substrate 102. For example, the substrate 400 may include one or more pads 402 located at a second surface 404 of the substrate, where the pads 402 include one or more of the features of the pads 126. Further, the substrate 400 may include one or more pads 406, where the pads 406 include one or more of the features of the pads 124. The pads 406 may be embedded within the substrate 400 when the method 300 is initiated. The substrate 400 may have been manufactured using a substrate production process, such as a build-up process.

A recess may be formed in the substrate (302). In embodiments, the recess may be formed via a machine cutting process, such as a routing process. In particular, the machine cutting process may be applied to a surface of the substrate to remove a portion of the material from the substrate, thereby forming the recess. The recess formed by the machine cutting process may extend into the substrate from the surface of the substrate to one or more pads embedded within the substrate, where the machine cutting process exposes the pads.

Figure 5:
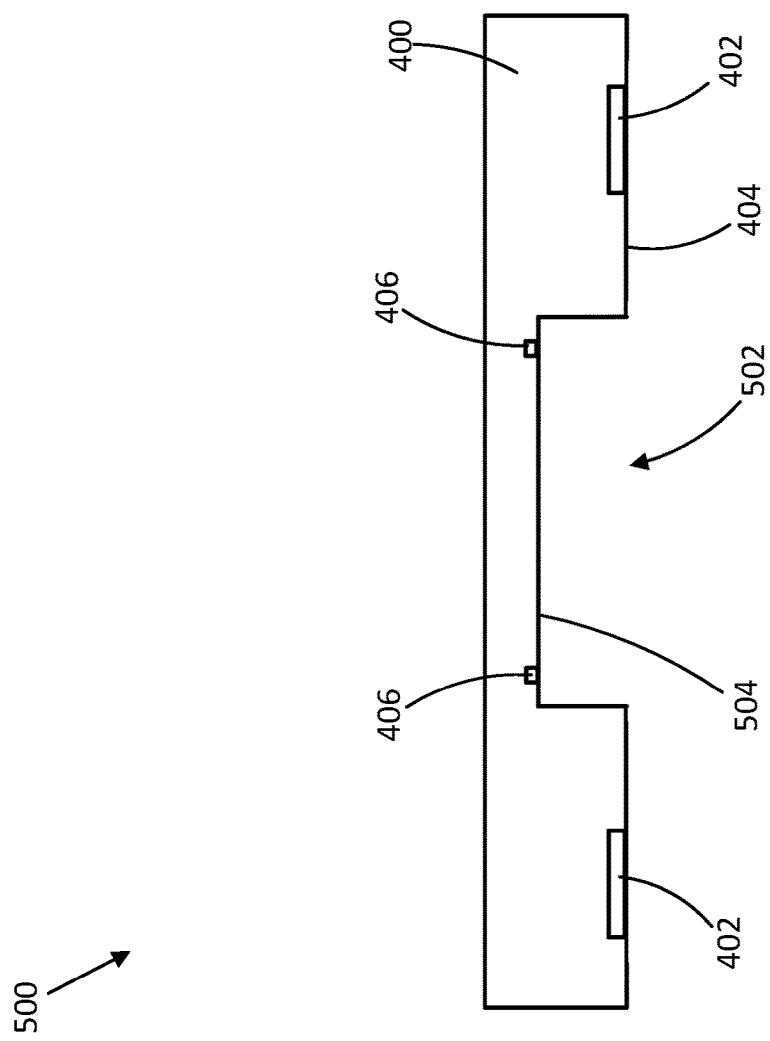
FIG. 5 is a cross-sectional view of an example product produced by forming the recess in the substrate according to the method of FIG. 3.

FIG. 5 is a cross-sectional view of an example product 500 produced by forming the recess in the substrate according to the method of FIG. 3. A recess 502 may have been formed in the substrate 400 via the machine cutting process 302. The recess 502 may include one or more of the features of the recess 106. The machine cutting process may have been applied to the second surface 404 of the substrate 400 to produce the recess 502. The machine cutting process may be applied to a portion of the second surface 404 located between the pads 402. The recess 502 may extend into the substrate 400 from the second surface 404 of the substrate 400 to the pads 406, thereby exposing the pads 406. Further, forming the recess 502 may produce an intermediate surface 504 of the substrate 400, wherein the intermediate surface 504 includes one or more of the features of the intermediate surface 118. For example, the pads 406 may be located at the intermediate surface 504 and may be exposed to the recess 502.

An aperture may be formed in the substrate (304). The aperture may be formed via a machine cutting process, such as a routing process. In particular, the machine cutting process may be applied to a surface of the substrate to remove a portion of the material from the substrate, thereby forming the aperture through the substrate. The aperture formed may extend from the recess formed through a surface of the substrate at an opposite side of the substrate from the recess.

Figure 6:
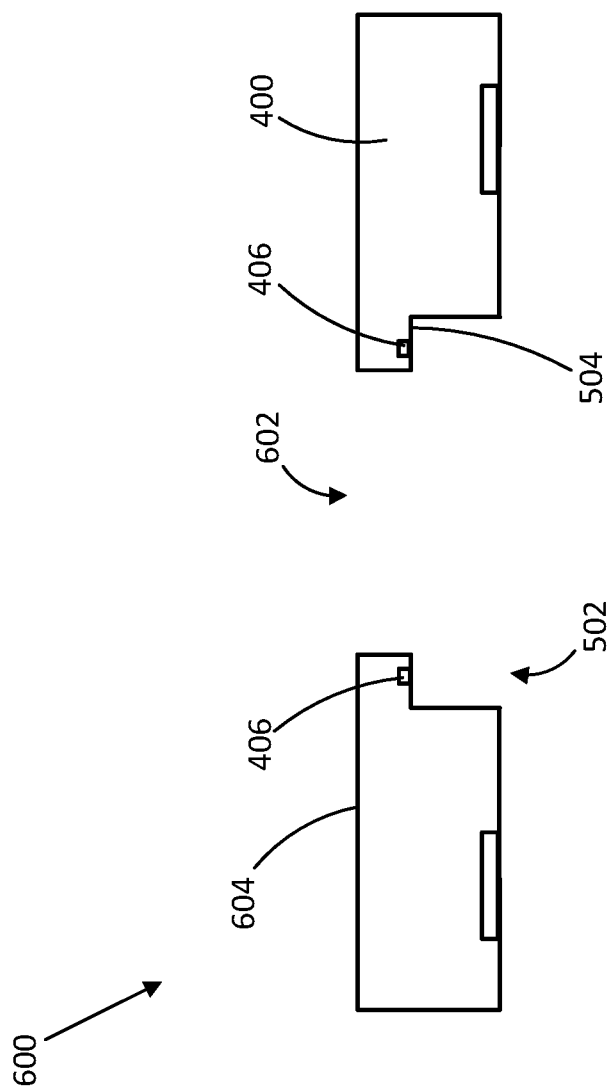
FIG. 6 is a cross-sectional view of an example product produced by forming the aperture in the substrate according to the method of FIG. 3.

FIG. 6 is a cross-sectional view of an example product 600 produced by forming the aperture in the substrate according to the method of FIG. 3. An aperture 602 may have been formed through the substrate 400 via the machine cutting process of stage 304. The aperture 602 may include one or more of the features of the aperture 104. The machine cutting process may have been applied to the intermediate surface 504 or a first surface 604 of the substrate 400 to produce the aperture 602. The machine cutting process for forming the aperture 602 may utilize a narrower tool than the machine cutting process for forming the recess 502, thereby causing the aperture 602 to have a narrower width than the recess 502. The aperture 602 may extend through the substrate 400 from the intermediate surface 504 to the first surface 604. The aperture 602 may be located between the pads 406 of the substrate 400.

While in the example method illustrated in FIG. 3 the recess 502 is illustrated as being formed prior to forming the aperture 602, it should be understood that the order may be reversed in other embodiments. In particular, the aperture 602 may be formed before the recess 502 in other embodiments. The aperture 602 may be formed through the substrate 400 from the first surface 604 to the second surface 404. The recess 502 may be formed from the second surface 404 after the aperture 602 has been formed in the substrate 400.

A hybridized device may be positioned in the recess (306). For example, a silicon backplane of the hybridized device may be positioned within the recess of the substrate with an LED array of the hybridized device directed toward the aperture of the substrate. When positioned within the recess, the silicon backplane may be located partially or entirely within the recess. Further, the LED array may be located within the recess and/or may be located partially within the aperture. The LED array may be located between the silicon backplane and the first surface of the substrate. The LED array may be coupled to a surface of the silicon backplane. The silicon backplane may be aligned with the pads of the substrate located at the intermediate surface that abuts the recess, such that the silicon backplane may be coupled to the pads via flipchip interconnects.

Figure 7:
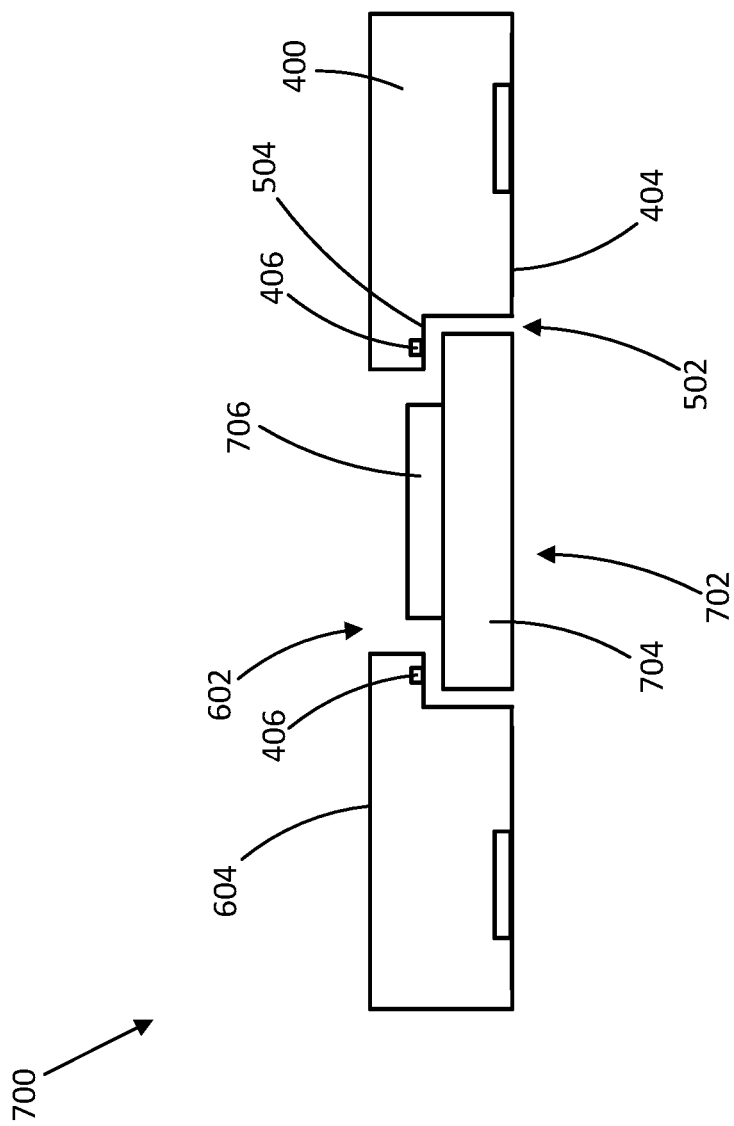
FIG. 7 is a cross-sectional view of an example product produced by positioning the hybridized device in the substrate according to the method of FIG. 3.

FIG. 7 is a cross-sectional view of an example product 700 produced by positioning the hybridized device in the substrate according to the method of FIG. 3. In the example illustrated in FIG. 7, a hybridized device 702 is positioned in the recess 502 of the substrate 400. The hybridized device 702 may include one or more of the features of the integrated LED 130. A silicon backplane 704 of the hybridized device 702 may be located within the recess 502. For example, the silicon backplane 704 may be located partially or entirely within the recess 502. In some embodiments, a portion of the silicon backplane 704 may extend past the second surface 404 out of the recess 502. An LED array 706 of the hybridized device 702 may be coupled to the silicon backplane 704 and may be directed toward the aperture 602. The LED array 706 may be located within the recess 502 and/or may be located partially within the aperture 602. The LED array 706 may be located between the silicon backplane 704 and the first surface 604. The silicon backplane 704 may be aligned with the pads 406 of the substrate 400, such that the silicon backplane 704 may be coupled to the pads via flipchip interconnects. In particular, portions of the silicon backplane 704 may be located adjacent to intermediate surface 504 where the pads 406 are located.

The hybridized device may be coupled to the substrate via one or more flipchip interconnects (308). For example, the flipchip interconnects may be formed between the pads at the intermediate surface of the substrate and the silicon backplane of the integrated LED. The flipchip interconnects may electrically couple the hybridized device and the substrate. The flipchip interconnects may comprise solder bump joints or copper pillar bump joints. In some embodiments, the flipchip interconnects may be formed by a wave flow process.

Figure 8:
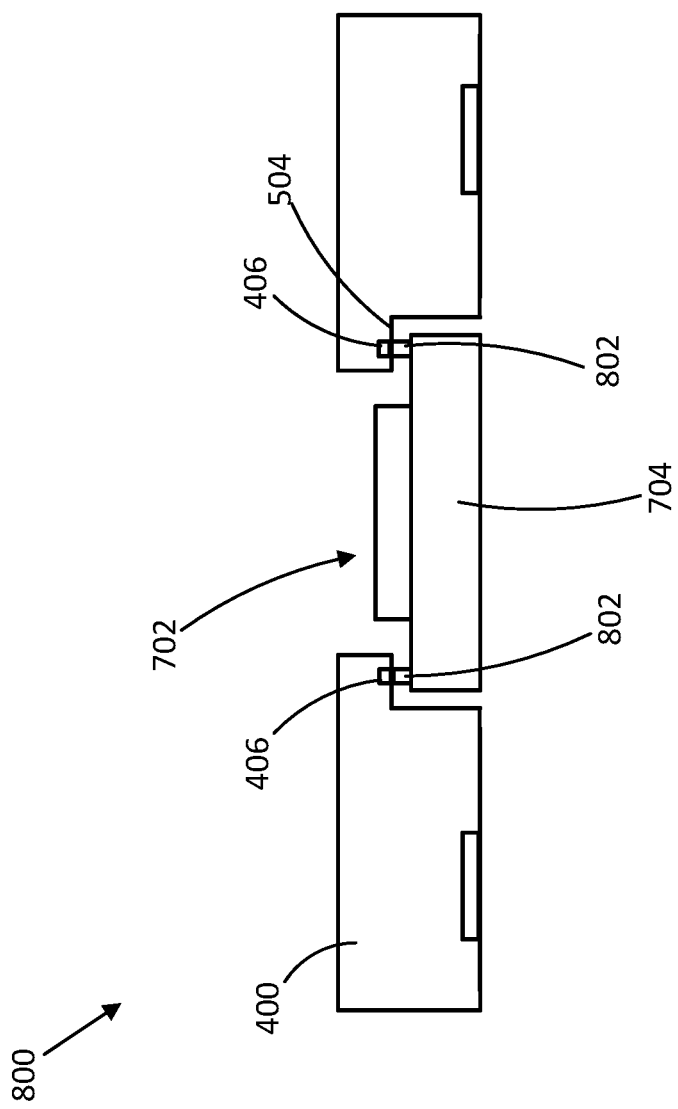
FIG. 8 is a cross-sectional view of an example product produced by coupling the hybridized device to the substrate via the one or more flipchip interconnects according to the method of FIG. 3.

FIG. 8 is a cross-sectional view of an example product 800 produced by coupling the hybridized device to the substrate via the one or more flipchip interconnects according to the method of FIG. 3. One or more flipchip interconnects 802 may be formed between the hybridized device 702 and the substrate 400. The flipchip interconnects 802 may include one or more of the features of the flipchip interconnects 148. The flipchip interconnects 802 may be formed between the silicon backplane 704 and the pads 406 at the intermediate surface 504 of the substrate 400. The flipchip interconnects 802 may electrically couple the silicon backplane 704 to the pads 406 and may provide for exchange of signals between the hybridized device 702 and the substrate 400. The flipchip interconnects 802 may comprise solder bump joints or copper bump joints.

An underfill material may be formed around the flipchip interconnects (310). The underfill material may encompass the flipchip interconnects and prevent the flipchip interconnects from being exposed. The underfill material may provide electrical insulation around the flipchip interconnects, thereby preventing electrical shorting between the flipchip interconnects and/or other electrical components of the LED package assembly. The underfill material may further provide physical support to the flipchip interconnects, thereby helping to maintain physical coupling between the substrate and the integrated LED.

Figure 9:
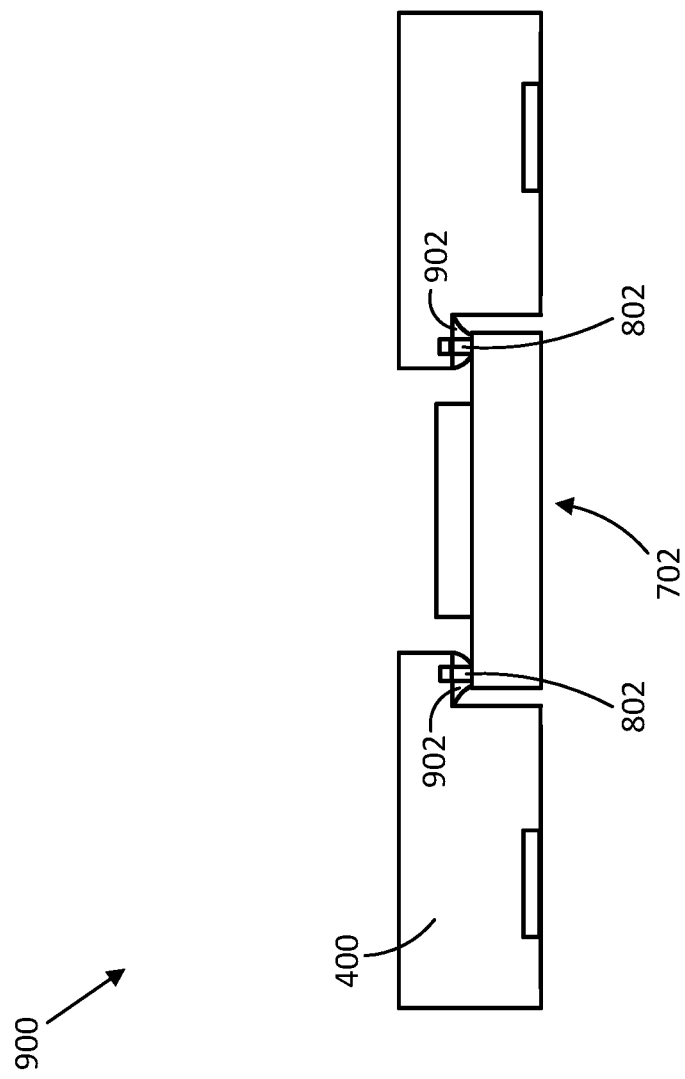
FIG. 9 is a cross-sectional view of an example product produced by forming the underfill material around the flipchip interconnects according to the method of FIG. 3.

FIG. 9 is a cross-sectional view of an example product 900 produced by forming the underfill material around the flipchip interconnects according to the method of FIG. 3. Underfill material 902 may be formed around the flipchip interconnects 802. The underfill material 902 may include one or more of the features of the underfill material 158. The underfill material 902 may surround each of the flipchip interconnects 802, thereby preventing exposure of the flipchip interconnects 802. For example, the underfill material 902 may encircle each of the flipchip interconnects 802. The underfill material 902 may comprise electrical insulation material that can prevent shorting between the flipchip interconnects 802 and/or other electrical components of the LED package assembly. The underfill material 902 may extend between the substrate 400 and the hybridized device 702, and may physically couple the substrate 400 and the hybridized device 702. The underfill material 902 may provide physical support between the substrate 400 and the hybridized device 702. In particular, the underfill material 902 may assist in maintaining physical coupling between the substrate 400 and the hybridized device. In other embodiments, the underfill material 902 may be omitted and stage 310, which produces the underfill material 902, may be omitted.

Electronic components may be coupled to the substrate (312). For example, electronic components may be coupled to the first surface of the substrate. The electronic components be or include passive components, active components, or some combination thereof.

Figure 10:
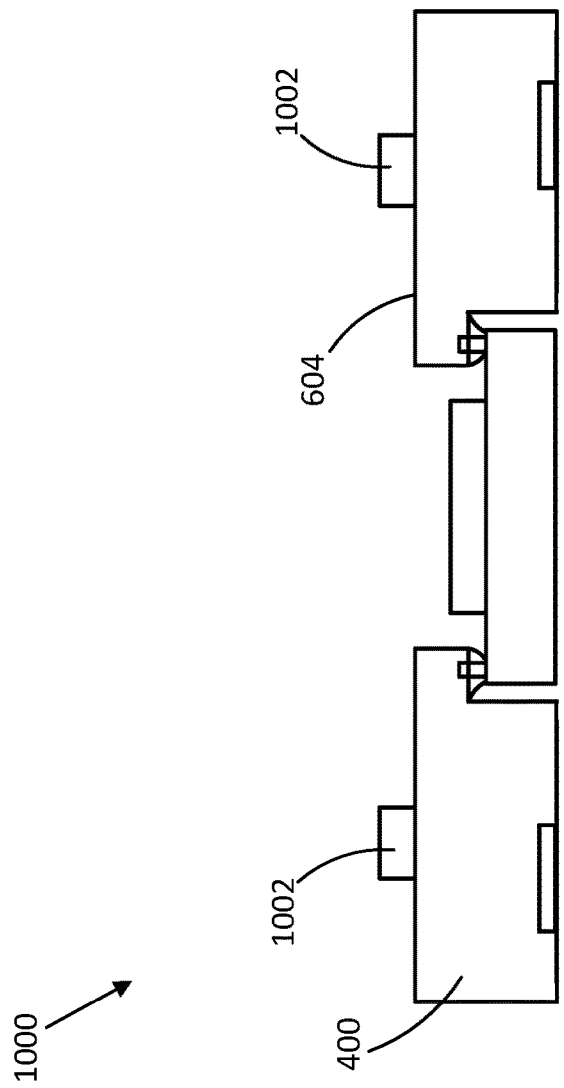
FIG. 10 is a cross-sectional view of an example product produced by coupling electronic components to the substrate according to the method of FIG. 3.

FIG. 10 is a cross-sectional view of an example product 1000 produced by coupling electronic components to the substrate according to the method of FIG. 3. One or more electronic components 1002 may be coupled to the first surface 604 of the substrate 400. The electronic components 1002 may include one or more of the features of the electronic components 128. The electronic components 1002 may be electrically coupled to the substrate 400, thereby allowing signals to be exchanged between the electronic components and the substrate. In other embodiments, the electronic components 1002 may be omitted and stage 312, which couples the electronic components 1002 to the substrate 400, may be omitted.

A circuit board may be coupled to the substrate (314). In particular, the circuit board may be coupled to pads of the substrate, where the pads are located on a second surface of the substrate. The coupling of the circuit board to the pads of the substrate may maintain the position of the circuit board and provide electrical coupling between the circuit board and the substrate. The circuit board may include an integrated heatsink. The integrated heatsink may be positioned adjacent to the silicon backplane and may be thermally coupled to the silicon backplane. In some embodiments, coupling the circuit board to the substrate may comprise applying a heat transfer compound between the silicon backplane and the integrated heatsink.

Figure 11:
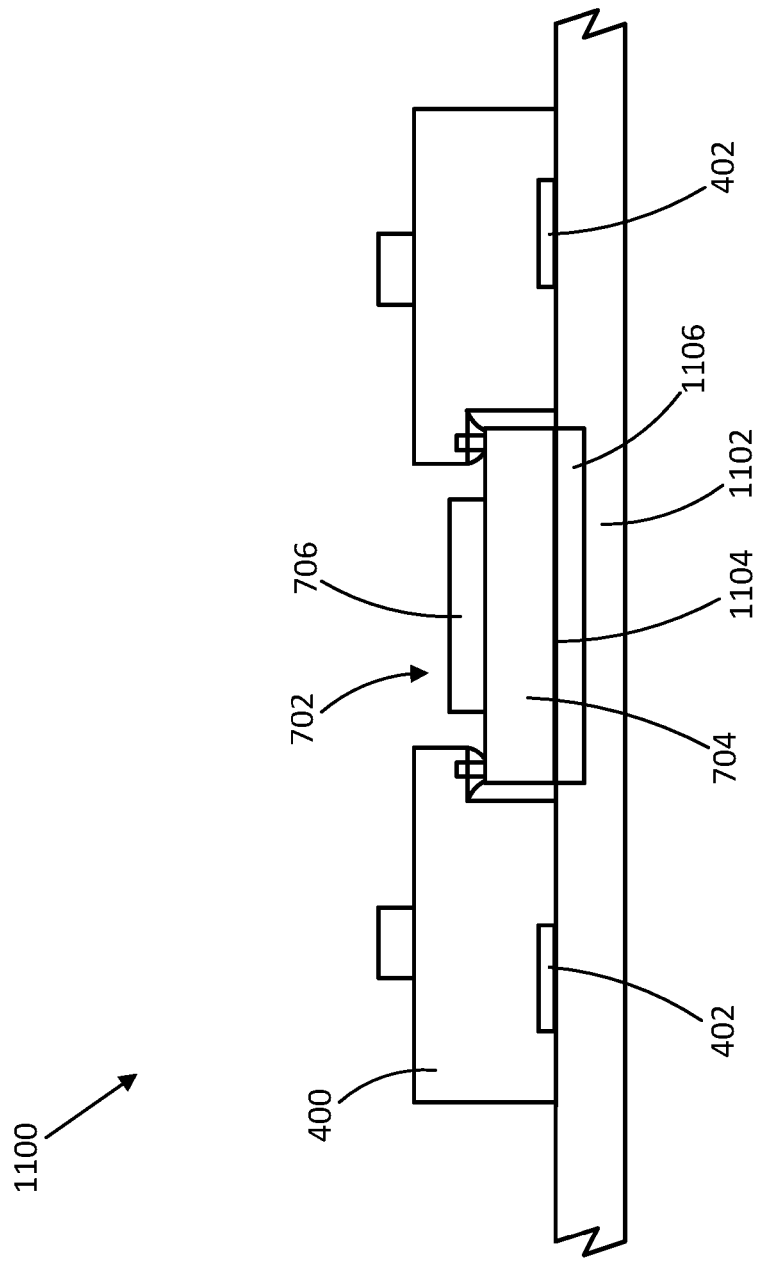
FIG. 11 is a cross-sectional view of an example product produced by coupling a circuit board to a substrate according to the method of FIG. 3.

FIG. 11 is a cross-sectional view of an example product 1100 produced by coupling a circuit board to a substrate according to the method of FIG. 3. In particular, the product 1100 may be a completed LED package assembly according to some embodiments. A circuit board 1102 may be coupled to the substrate 400. The circuit board 1102 may include one or more of the features of the circuit board 160. In particular, the circuit board 1102 may be coupled to pads 402 of the substrate 400. The coupling of the circuit board 1102 with the pads 402 may maintain a position of the circuit board 1102 and provide for electrical coupling between the circuit board 1102 and the substrate 400. Further, the substrate 400 may provide for electrical coupling between the circuit board 1102 and the hybridized device 702. The circuit board 1102 may include an integrated heatsink 1106. The integrated heatsink 1106 may be positioned against a surface 1104 of the silicon backplane 704, the surface 1104 of the silicon backplane 704 being on an opposite side of the silicon backplane 704 from the hybridized device 706. The integrated heatsink 1106 may be thermally coupled to the silicon backplane 704 and may facilitate cooling of the hybridized device 702. In some embodiments, a heat transfer compound may be applied between the integrated heatsink 1106 and the silicon backplane 704 to facilitate heat transfer between the integrated heatsink 1106 and the hybridized device 702. In some embodiments, the integrated heatsink 1106 may be omitted from the circuit board 1102.

Figure 12:
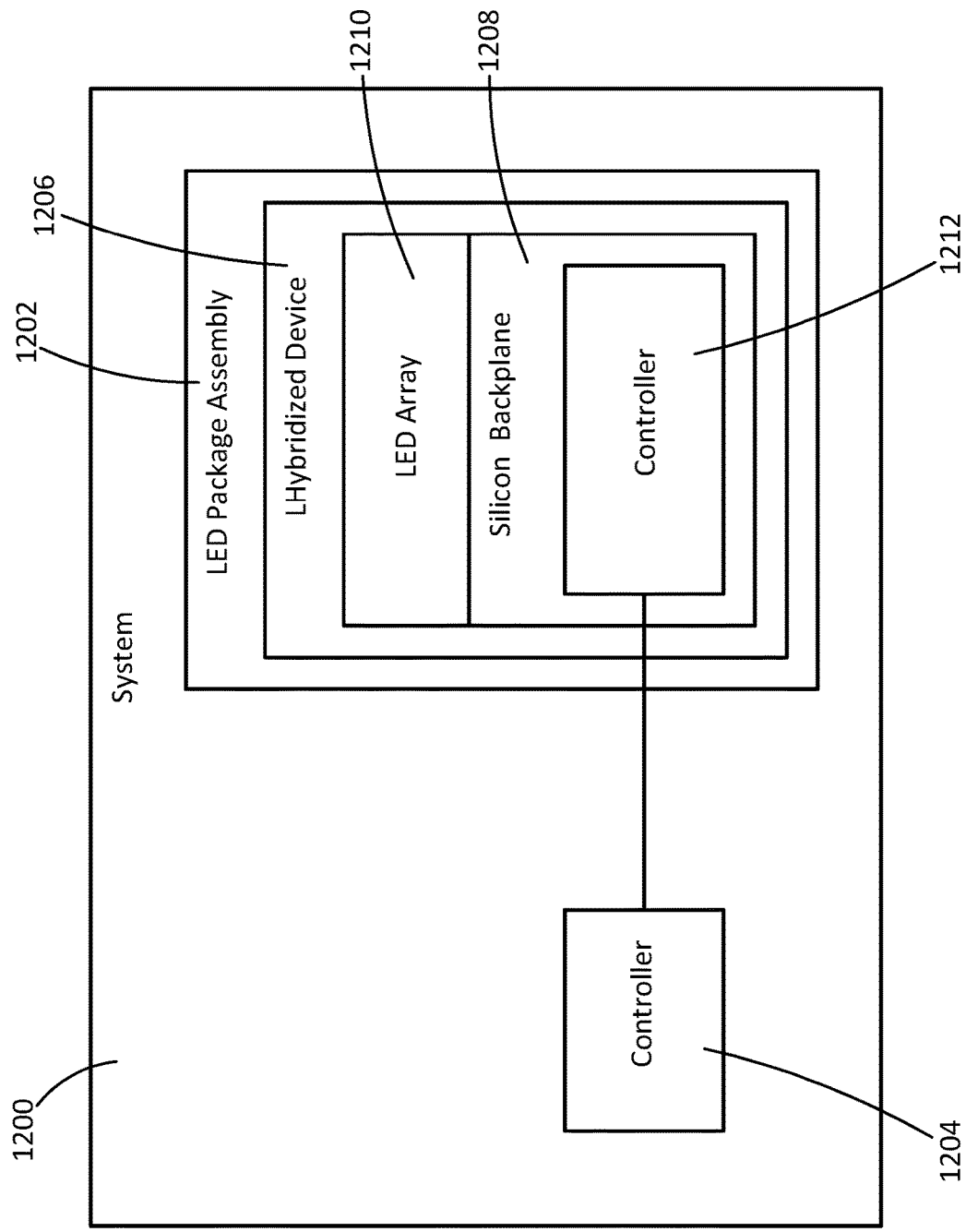
FIG. 12 is a block diagram of an example system that includes an LED package assembly.

FIG. 12 is a block diagram of an example system 1200 that includes an LED package assembly 1202. For example, the system 1200 may include a lighting system or a display system that may utilize the LED package assembly 1202 to provide lighting and/or a display. In some embodiments, the system 1200 may be or include a headlight for a vehicle, a light, a handheld device (such as a smartphone, a smartwatch, and/or electronic organizer), a display for a system (such as a computer display and/or a television display), or some combination thereof. While components of the system 1200 are illustrated, it should be understood that the system 1200 may include additional components and/or alternative components that perform the functions of the described components in some embodiments.

The system 1200 may include a controller 1204. The control 1204 may determine an image to be displayed by the LEDs of the LED package assembly 1202. For example, the controller 1204 may include or be coupled to a processor that may indicate an image to be displayed by the LEDs or segments. The image may be a user interface, an arrangement of light, an intensity of light, one or more symbols to be displayed by the LEDs, or some combination thereof. The controller 1204 may generate image data that indicates an image to be displayed by the LEDs and may provide the image data to components of the system 1200. The image data may be or include a signal that indicates the image to be produced by the LEDs.

The system 1200 may include the LED package assembly 1202. The LED package assembly 1202 may include one or more of the features of the LED package assembly 100. For example, the LED package assembly 1202 may include a substrate, such as substrate 102, with a hybridized device 1206 coupled to the substrate via one or more flipchip interconnects, such as the flipchip interconnects 148. The hybridized device 1206 may include one or more of the features of the hybridized device 210. For example, the hybridized device 1206 may include a silicon backplane 1208 and an LED array 1210, where the silicon backplane 1208 may include one or more of the features of the silicon backplane 214 and the LED array 1210 may include one or more of the features of the LED array 212. The LED array 1210 may include one or more LEDs, μLEDs and/or segments that provide light and/or a display for the system 1200.

The silicon backplane 1208 may include a controller 1212. The controller 1212 may be coupled to the controller 1204 and may receive the image data from the controller 1204. The controller 1212 may determine an image to be displayed by the LEDs of the LED array 1210 based on the image data received from the controller 1204. The controller 1212 may determine actions to be taken by the LED device 1210 and the LEDs or segments of the LED array 1210 to produce the image and may cause the LED array 1210 and the LEDs or segments of the LED device 1210 to take the actions. For example, the controller 1212 may determine when each of the LEDs or segments of the LED array 1210 are to be turned on to produce the image and may cause the LEDs or segments to be turned on (such as by activating corresponding switches of the silicon backplane 2108 to cause the LEDs or segments to turn on in accordance with the times that the LEDs or segments are to be turned on. Further, the controller 1212 may determine the intensity of light to be emitted by the LEDs and/or the color of light to be emitted by the LEDs and may cause the LEDs to emit the determined intensity of light and/or color of light.

Figure 13:
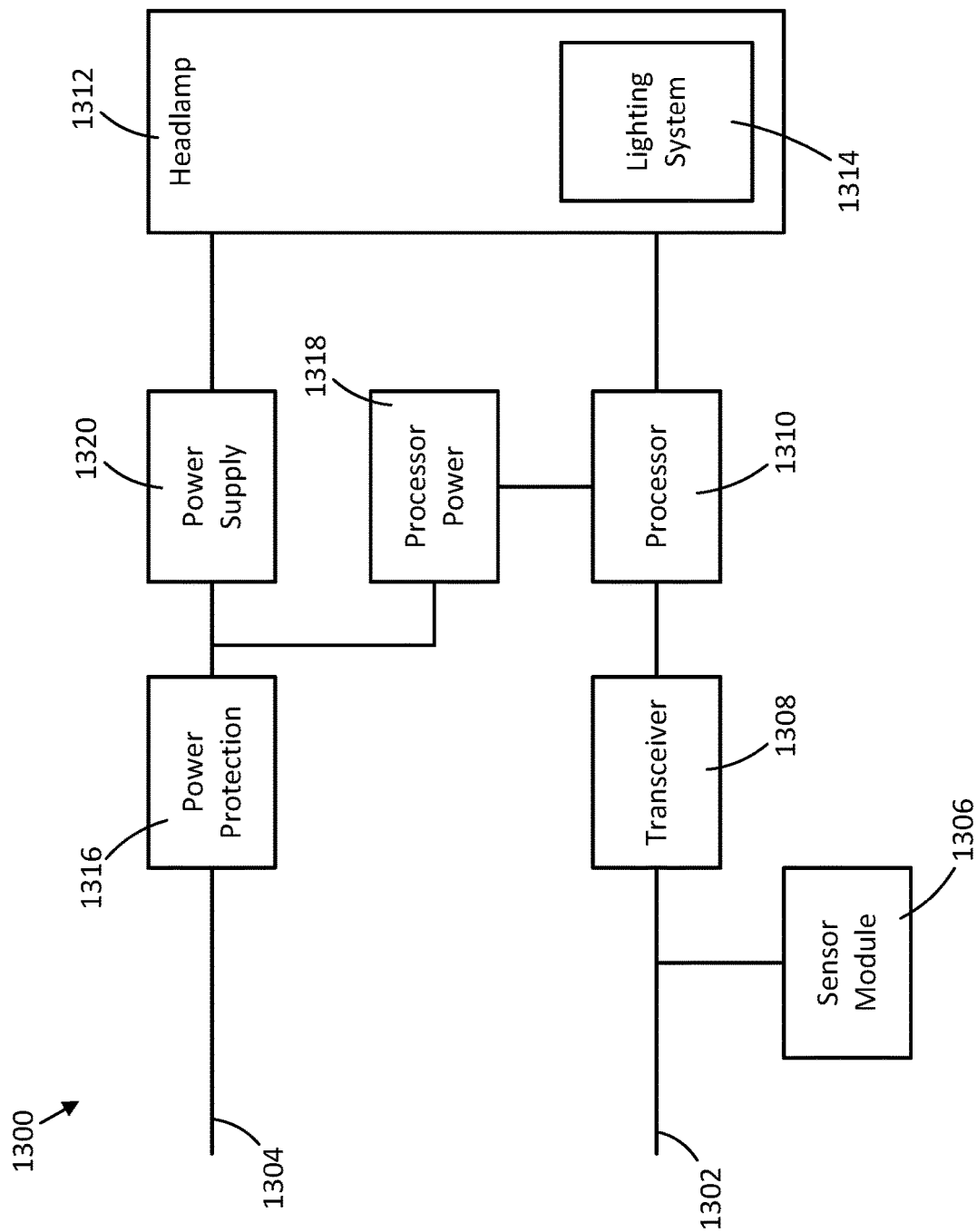
FIG. 13 is a block diagram of another example system.

FIG. 13 is a block diagram of another example system 1300. In some embodiments, the system 1300 may be or include a portion of a vehicle headlamp system in some embodiments. For example, the system 1300 may be or include an active headlamp system in some embodiments, where an intensity of light and/or image of the light output by the system 1300 may be changed. The system 1300, or portions thereof, may reside in a vehicle, in a headlamp of a vehicle, or some combination thereof. The system 1300 may implement a pixelated configuration made possible by an array of LEDs.

The system 1300 may be coupled to a bus 1302 of the vehicle and a power source 1304. The power source 1304 may provide power for the system 1300. The bus 1302 may be coupled to one or more components that can provide data and/or utilize data provided to the system 1300. The data provided on the bus 1302 may be related to environment conditions around the vehicle (such as a time of day, whether there is rain, whether there is fog, ambient light levels, and other environmental data), conditions of the vehicle (such as whether the vehicle is parked, whether the vehicle is in-motion, a current speed of the vehicle, a current direction of travel of the vehicle), and/or presence/positions of other vehicles or pedestrians around the vehicle. The system 1300 may provide feedback (such as information regarding operation of the system) to the components.

The system 1300 may further include a sensor module 1306. In some embodiments, the sensor module 1306 may include one or more sensors that can sense surroundings of the vehicle. For example, the one or more sensors may sense surroundings that can affect an image to be produced by light emitted by the system 1300. In some embodiments, the sensors may sense environmental conditions around the vehicle, and/or presence/positions of other vehicles or pedestrians around the vehicle. The sensor module 1306 may operate in combination with the data provided on the bus 1302 or may operate in lieu of a portion of the data (such as the environment conditions, and/or the presence/positions of the other vehicles or pedestrians) being provided on the bus 1302. The sensor module 1306 may output data indicating what has been sensed by the sensors.

The system 1300 may further include a transceiver 1308. The transceiver 1308 may have a universal asynchronous receiver-transmitter (UART) interface or a serial peripheral interface (SPI) in some embodiments. The transceiver 1308 may be coupled to the bus 1302 and the sensor module 1306, and may receive data from the bus 1302 and the sensor module 1306. In some embodiments, the transceiver 1308 may multiplex the data received from the bus 1302 and the sensor module 1306, and may direct feedback to the bus 1302 or the sensor module 1306.

The system 1300 may further include a processor 1310. The processor 1310 may be coupled to the transceiver 1308 and exchange data with the transceiver 1308. For example, the processor 1310 may receive data from the transceiver 1308 that was provided by the bus 1302 and/or the sensor module 1306. The processor 1310 may generate image data that indicates an image to be produced by light emitted from the system 1300. The processor 1310 may further generate one or more inquiries that request information from one or more of the components of the system. The processor 1310 may further provide the feedback to the transceiver 1308 to be directed to the bus 1302 or the sensor module 1306.

The system 1300 may further include a headlamp 1312 of the vehicle. The headlamp 1312 may be or include an active headlamp in some embodiments, where the active headlamp may produce multiple different outputs of light. The headlamp 1312 may include a lighting system 1314. The lighting system 1314 may include an LED package assembly, such as the LED package assembly 100, or some portion thereof. For example, the lighting system 1314 may include the substrate 102 and the hybridized device 210 in some embodiments. The headlamp 1312 may be coupled to the processor 1310 and may exchange data with the processor 1310. In particular, the lighting system 1314 may be coupled to the processor 1310 and may exchange data with the processor 1310. The lighting system 1314 may receive the image data and inquiries from processor 1310 and may provide feedback to the processor 1310.

The system 1300 may further include power protection 1316. The power protection 1316 may be coupled to the power source 1304 and may receive power from the power source. The power protection 1316 may include one or more filters that may reduce conducted emissions and provide power immunity. In some embodiments, the power protection 1316 may provide electrostatic discharge (ESD) protection, load-dump protection, alternator field decay protection, reverse polarity protection, or some combination thereof.

The system 1300 may further include processor power 1318. The processor power 1318 may be coupled to the power protection 1316 and may receive power from the power source 1304. The processor power 1318 may comprise a low-dropout (LDO) regulator that may generate a power for powering the processor 1310 from the power provided by the power source 1304. The processor power 1318 may further be coupled to the processor 1310 and may provide power to the processor 1310.

The system 1300 may further include a power supply 1320. The power supply 1320 may be coupled to the power protection 1316 and may receive power from the power source 1304. In some embodiments, the power supply 1320 may comprise a converter that converts the power from the power source 1304 to power for the headlamp 1312. For example, the power supply 1320 may comprise a direct current (DC)-to-DC converter that converts the power from the power supply 1320 from a first voltage to a second voltage for the lighting system 1314 of the headlamp 1312.

Figure 14:
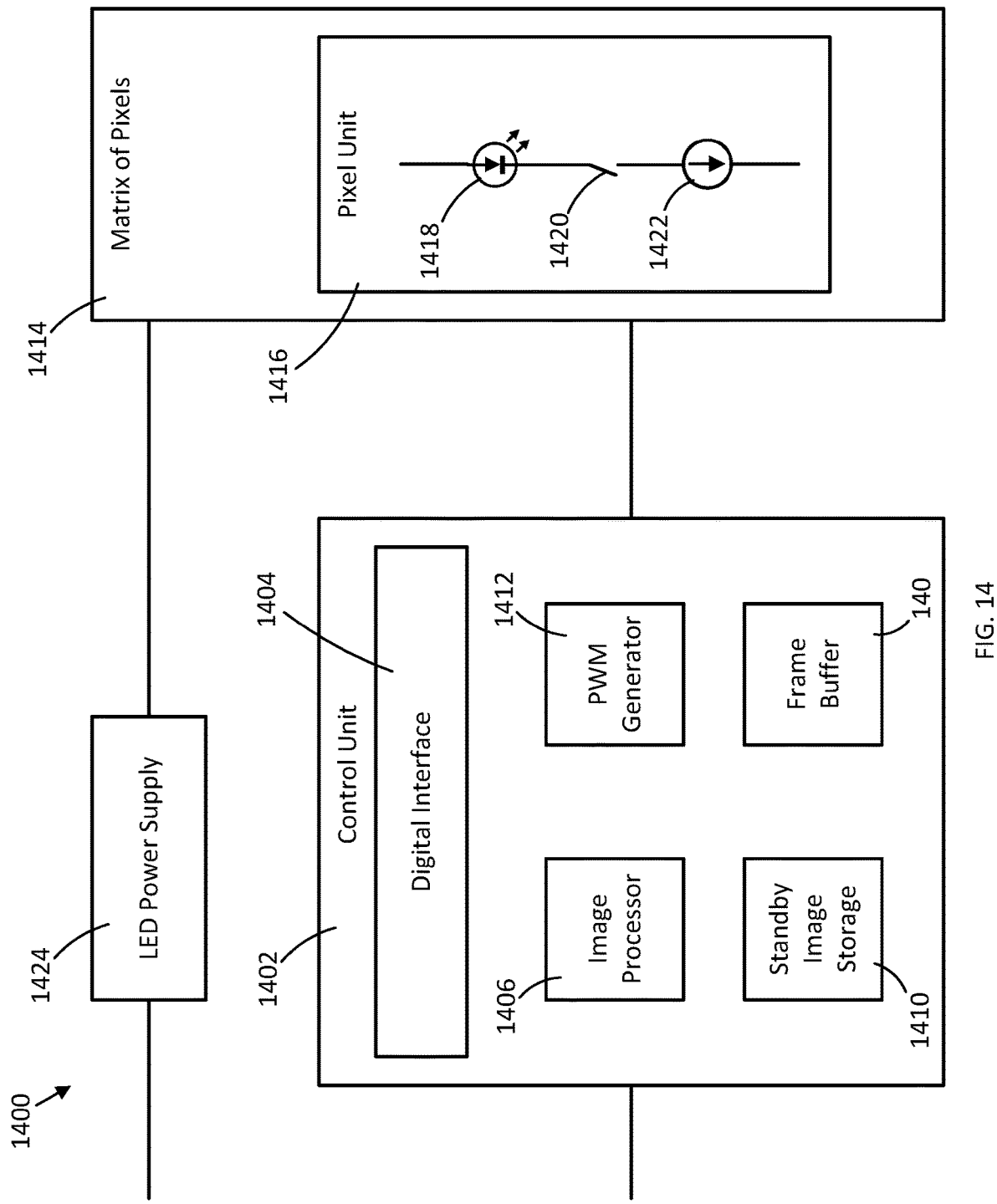
FIG. 14 is a block diagram of an example lighting system.

FIG. 14 is a block diagram of another example lighting system 1400, according to some embodiments. For example, the system 1300 of FIG. 13 may include one or more of the features of the lighting system 1400. The lighting system 1400 may be implemented in a headlamp, such as the headlamp 1312 of FIG. 13.

The lighting system 1400 may include a control unit 1402. The control unit 1402 may be coupled to a processor such as the processor 1310 of FIG. 13. The control unit 1402 may receive image data and inquiries from the processor. The control unit 1402 may further provide feedback to the processor.

The controller 1402 may include a digital interface 1404. The digital interface 1404 may facilitate communication with the processor and other components within the lighting system 1400. For example, the digital interface 1404 may be or include an SPI interface in some embodiments, where the SPI interface may facilitate communication.

The control unit 1402 may further include an image processor 1406. The image processor 1406 may receive the image data via the digital interface 1404 and may process the image data to produce indications of pulse width modulation (PWM) duty cycles and/or intensities of light for causing the lighting system 1400 to produce the images indicated by the image data.

The control unit 1402 may further include a frame buffer 1408 and a standby image storage 1410. The frame buffer 1408 may receive the indications produced by the image processor 1406 and store the indications for implementation. The standby image storage 1410 may further store indications of PWM duty cycles and/or intensities of light. The indications stored in the standby image storage 1410 may be implemented in the absence of indications stored in the frame buffer 1408. For example, the frame buffer 1408 may retrieve the indications from the standby image storage 1410 when the frame buffer 1408 is empty.

The controller 1402 may further include a PWM generator 1412. The PWM generator 1412 may receive the indications from the frame buffer 1408 and may produce PWM signals in accordance with the indications. The PWM generator 1412 may further determine intensities of light based on the indications and produce a signal to cause the intensities of light to be produced.

The lighting system 1400 may include a µLED array 1414. The µLED array 1414 may include a plurality of pixels, where each of the pixels include a pixel unit 1416. In particular, the pixel unit 1416 may include an LED 1418, a PWM switch 1420, and a current source 1422. The pixel unit 1416 may receive the signals from the PWM generator 1412. The PWM signal from the PWM generator 1412 may cause the PWM switch 1420 to open and close in accordance with the value of the PWM signal. The signal corresponding to the intensities of light may cause the current source 1422 produce a current flow to cause the LED 1418 to produce the corresponding intensities of light.

The lighting system 1400 may further include an LED power supply 1424. The LED power supply 1424 may be coupled to the power supply 1320 of FIG. 13 and may receive power from the power supply 1320. The LED power supply 1424 may produce power for the LEDs of the μLED array 1414. The LED power supply 1424 may be coupled to the μLED array 1414 and may provide the power for the LEDs to the μLED array 1414.

Figure 15:
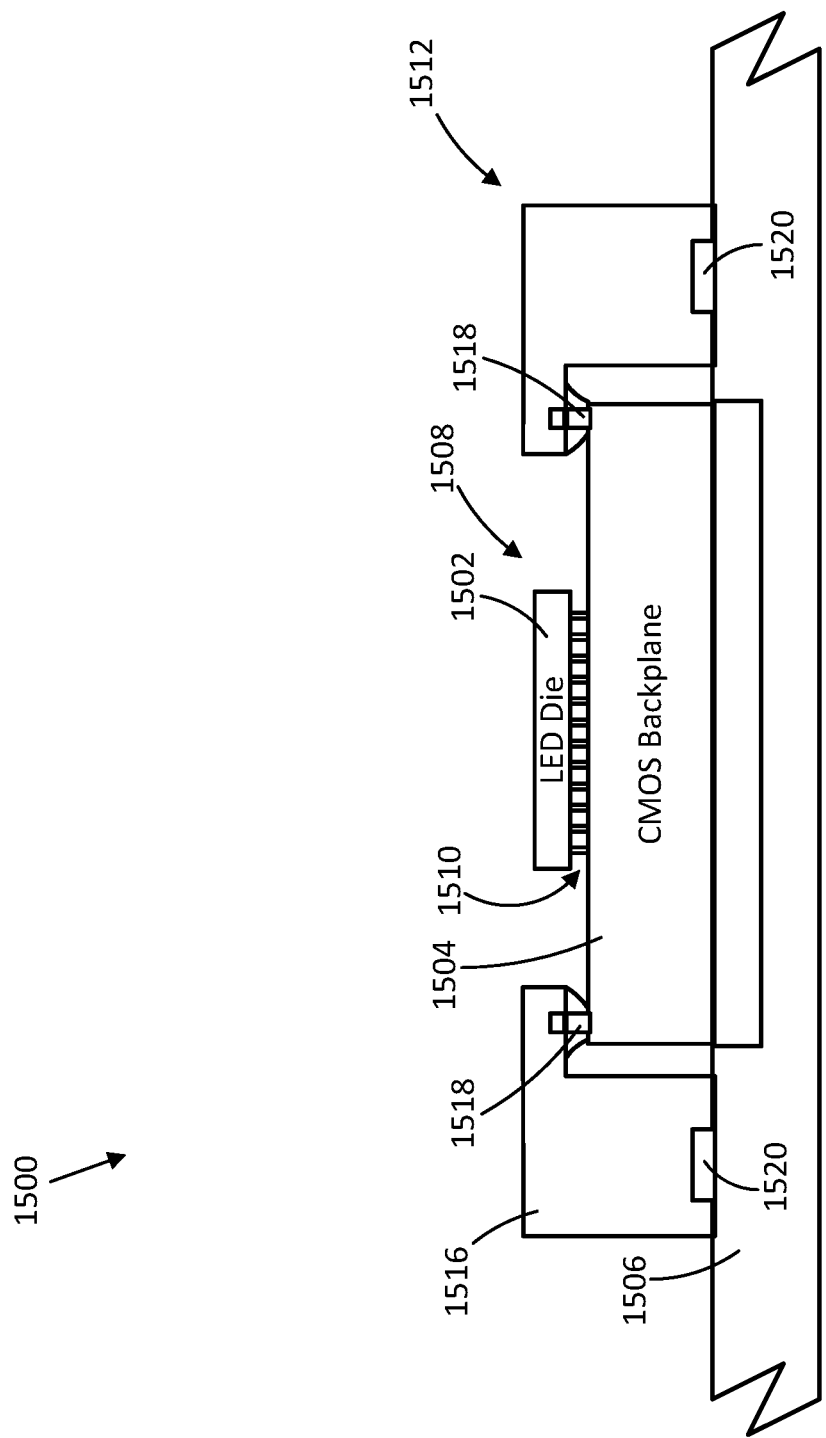
FIG. 15 is an example hardware arrangement for implementing the system of FIG. 13.

FIG. 15 is an example hardware arrangement 1500 for implementing the system 1300 of FIG. 13, according to some embodiments. In particular, the hardware arrangement 1500 may illustrate hardware components that may implement the system 1300.

The hardware arrangement 1500 may include an LED package assembly 1512. The LED package assembly 1512 may have been produced by the method 300 of FIG. 3. The LED package assembly 1512 may include one or more of the features of the LED package assembly 100 of FIG. 1. For example, the LED package assembly 1512 may include a hybridized device 1508 having a silicon backplane 1504 and an LED array 1502. The LED array 1502 may be coupled to the silicon backplane by one or more interconnects 1510, where the interconnects 1510 may provide for transmission of signals between the LED die 1502 and the silicon backplane 1504. The interconnects 1510 may comprise one or more solder bump joints, one or more copper pillar bump joints, or some combination thereof.

The LED array 1502 may also include circuitry to implement the μLED array 1414 of FIG. 14. In particular, the LED array 1502 may include a plurality of pixels of the μLED array 1414. The LED array 1502 may include a shared active layer and a shared substrate for the μLED array 1414, thereby having the μLED array 1414 that is a monolithic μLED array. Each pixel of the μLED array 1414 may include an individual segmented active layer and/or substrate. Accordingly, the LED array 1502 may be a monolithic die that has a segmented surface with a corresponding pixel of the μLED array 1214 occupying each segment of the surface. In some embodiments, the LED array 1502 may further include the PWM switches and the current sources of the μLED array 1414. In other embodiments, the PWM switches and the current sources may be included in the silicon backplane 1504.

The silicon backplane 1504 may include circuitry to implement the controller 1402 of FIG. 14 and the LED power supply 1424 of FIG. 14. The silicon backplane 1504 may utilize the interconnects 1510 to provide the μLED array 1414 with the PWM signals and the signals for the intensity for causing the μLED array 1414 to produce light in accordance with the PWM signals and the intensity.

The LED package assembly 1512 may further include a substrate 1516. The substrate 1516 may be coupled to the silicon backplane 1504 via one or more flipchip interconnects 1518. The flipchip interconnects 1518 may include one or more of the features of the flipchip interconnects 148.

The hardware arrangement 1500 may further include a circuit board 1506. The circuit board 1506 may include one or more of the features of the circuit board 160 of FIG. 1. The circuit board 1506 may include circuitry to implement the power protection 1316 of FIG. 13, the power supply 1320 of FIG. 13, the processor power 1318 of FIG. 13, the sensor module 1306 of FIG. 13, the transceiver 1308 of FIG. 13), the processor 1310 of FIG. 13, or portions thereof. The circuit board 1506 may be coupled to the substrate 1516, where the substrate 1516 may facilitate communication between the circuit board 1506 and the hybridized device 1508. For example, the circuit board 1506 may be coupled to the substrate 1516 via pads 1520 in the illustrated embodiment. The circuit board 1506 and the silicon backplane 1504, via the substrate 1516, may exchange image data, power, and/or feedback via the coupling, among other signals.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light-emitting diode (LED) package assembly, comprising:
    a substrate comprising a top surface, a bottom surface and an opening formed through the substrate, the opening comprising a first portion adjacent the top surface and a second portion adjacent the bottom surface that is wider than the first portion such that portions of the substrate overhang the second portion of the opening;
    a plurality of pads on a bottom surface of the portions of the substrate that overhang the second portion of the opening; and
    a hybridized device in the opening, the hybridized device comprising:
        a silicon backplane comprising a top surface, a bottom surface and a plurality of interconnects on the top surface, the plurality of interconnects being electrically coupled to the plurality of pads, and
        an LED array on the top surface of the silicon backplane.

2. The LED package assembly of claim 1, wherein the plurality of interconnects comprise at least one of solder bump joints or copper pillar bump joints.

3. The LED package assembly of claim 1, wherein the LED array is between the top surface of the substrate and the silicon backplane.

4. The LED package assembly of claim 1, wherein the portions of the substrate that overhang the second portion of the opening form an intermediary surface between the top surface of the substrate and the bottom surface of the substrate, the intermediary surface being substantially parallel to the top surface and the bottom surface of the substrate, and the plurality pads being on the intermediary surface.

5. The LED package assembly of claim 1, wherein an entirety of the silicon backplane is within the second portion of the opening.

6. The LED package assembly of claim 1, wherein at least a portion of the LED array is within the first portion of the opening.

7. The LED package assembly of claim 1, further comprising a heat sink thermally coupled to the bottom surface of the silicon backplane.

8. The LED package assembly of claim 1, wherein the LED array is a monolithic array comprising a plurality of light-emitting segments.

9. The LED package assembly of claim 8, wherein the silicon backplane comprises a plurality of drivers, one of the plurality of drivers being electrically coupled to provide a drive current to one or a subset of the plurality of light-emitting segments.

\* \* \* \* \*